(12) United States Patent
Fuji

(10) Patent No.: US 12,249,560 B2
(45) Date of Patent: Mar. 11, 2025

(54) ELECTRONIC DEVICE AND METHOD FOR MANUFACTURING ELECTRONIC DEVICE

(71) Applicant: ROHM CO., LTD., Kyoto (JP)

(72) Inventor: Kazunori Fuji, Kyoto (JP)

(73) Assignee: ROHM CO., LTD., Kyoyo (JP)

( * ) Notice: Subject to any disclaimer, the term of this patent is extended or adjusted under 35 U.S.C. 154(b) by 569 days.

(21) Appl. No.: 17/430,995

(22) PCT Filed: Mar. 11, 2020

(86) PCT No.: PCT/JP2020/010600
§ 371 (c)(1),
(2) Date: Aug. 13, 2021

(87) PCT Pub. No.: WO2020/195847
PCT Pub. Date: Oct. 1, 2020

(65) Prior Publication Data
US 2022/0148944 A1 May 12, 2022

(30) Foreign Application Priority Data
Mar. 26, 2019 (JP) .................................. 2019-057932

(51) Int. Cl.
*H01L 23/495* (2006.01)
*H01L 21/48* (2006.01)
*H01L 23/31* (2006.01)

(52) U.S. Cl.
CPC .... *H01L 23/49513* (2013.01); *H01L 21/4825* (2013.01); *H01L 23/3114* (2013.01);
(Continued)

(58) Field of Classification Search
None
See application file for complete search history.

(56) References Cited

U.S. PATENT DOCUMENTS 6,670,222 B1 * 12/2003 Brodsky ................. H01L 24/32
438/118
2008/0150163 A1 * 6/2008 Ohse ....................... H01L 24/83
257/E23.04
(Continued)

FOREIGN PATENT DOCUMENTS

CN 101295695 A 10/2008
CN 102148213 A 8/2011
(Continued)

OTHER PUBLICATIONS

International Search Report issued in PCT/JP2020/010600, Jun. 23, 2020 (3 pages).
(Continued)

*Primary Examiner* — Cory W Eskridge
(74) *Attorney, Agent, or Firm* — HSMLP .C.

(57) ABSTRACT

An electronic device A1 of the present disclosure includes an electronic component 1, a support member (die pad portion 21 of a lead frame 2) including a mount surface (obverse surface 211) carrying the electronic component 1, and a bonding material 3 provided between the electronic component 1 and the support member (die pad portion 21) for fixing the electronic component 1 to the support member (die pad portion 21). The mount surface (obverse surface 211) includes a first region 211a where a plurality of grooves 711 are formed and a second region 211b that surrounds the first region 211a as viewed in the z direction. The bonding material 3 is in contact with the first region 211a, and is not in contact with the second region 211b. This configuration serves to achieve an improvement in the reliability of the electronic device.

22 Claims, 19 Drawing Sheets

(52) U.S. Cl.
CPC .... *H01L 23/4952* (2013.01); *H01L 23/49548* (2013.01); *H01L 23/49582* (2013.01)

(56) References Cited

U.S. PATENT DOCUMENTS

| 2010/0052149 | A1* | 3/2010 | Nose | H01L 23/49513 |
| | | | | 257/692 |
| 2019/0311974 | A1* | 10/2019 | Hashizume | H01L 23/3142 |
| 2021/0193590 | A1* | 6/2021 | Wang | G06T 7/70 |

FOREIGN PATENT DOCUMENTS

| JP | 2006-303216 A | 11/2006 |
| JP | 2006-310609 A | 11/2006 |
| JP | 2010-165990 A | 7/2010 |
| JP | 2014-203861 A | 10/2014 |
| JP | 2015-144228 A | 8/2015 |
| JP | 2016-149516 A | 8/2016 |
| JP | 2017-54878 A | 3/2017 |
| JP | 2017-118050 A | 6/2017 |
| JP | 2019-40994 A | 3/2019 |
| JP | 2019-186326 A | 10/2019 |
| WO | 2014/038587 A1 | 3/2014 |
| WO | 2015/151273 A1 | 10/2015 |

OTHER PUBLICATIONS

Office Action received in the corresponding Japanese Patent application, Apr. 25, 2023, and English translation (11.
Office Action received in the corresponding Chinese Patent application, May 17, 2023, and machine translation (15 pages).
Office Action received in the corresponding Chinese Patent application, Dec. 27, 2023, and machine translation (15 pages).
Decision of Rejection received in the corresponding Chinese Patent application, Mar. 15, 2024 and machine translation (16 pages).
Office Action received in the corresponding Japanese Patent application, Jul. 23, 2024, and machine pages (33 pages).

* cited by examiner

ELECTRONIC DEVICE AND METHOD FOR MANUFACTURING ELECTRONIC DEVICE

TECHNICAL FIELD

The present disclosure relates to an electronic device and a method for manufacturing an electronic device.

BACKGROUND ART

Patent Document 1 discloses a conventional electronic device. The electronic device disclosed in Patent Document 1 includes a lead frame (metal member), a semiconductor element (electronic component), and a molding resin (resin member). The semiconductor element is mounted on the lead frame through, for example, soldering. The molding resin covers a portion of the lead frame and the semiconductor element.

PRIOR ART DOCUMENT

Patent Document

Patent Document 1: JP-A-2006-310609

SUMMARY OF THE INVENTION

Problem to be Solved by the Invention

Soldering described above includes a method such as, for example, reflow soldering. In the reflow soldering, solder temporarily turns into a liquid. At this time, the solder in the form of a liquid may flow out to an unintended place. The flow of the solder to an unintended place causes problems in the electronic device such as short circuiting, a reduction in electric properties, a reduction in thermal properties, and a bonding failure of the semiconductor element, which results in a reduction in the reliability of the electronic device.

The present disclosure has been conceived in view of the problem described above, and it is an object of the present disclosure to provide an electronic device with improved reliability and a method for manufacturing the electronic device.

Means for Solving the Problem

An electronic device provided in accordance with a first aspect of the present disclosure includes: an electronic component; a support member that includes a mount surface on which the electronic component is mounted; and a bonding material that is provided between the electronic component and the support member to fixedly attach the electronic component to the support member. The mount surface includes a first region where a plurality of grooves are formed and a second region that surrounds the first region as viewed in a first direction, and the bonding material is in contact with the first region, and is not in contact with the second region.

A method for manufacturing an electronic device provided in accordance with a second aspect of the present disclosure includes: a first step of preparing a support member that includes a mount surface; a second step of forming, in the mount surface, a first region and a second region that surrounds the first region as viewed in a first direction; a third step of applying a bonding material to the first region; a fourth step of placing an electronic component on the bonding material; and a fifth step of heating and cooling the bonding material such that the electronic component is fixedly attached to the support member by the bonding material. In the second step, the first region is formed by forming a plurality of grooves in a portion of the mount surface, and the bonding material after the fifth step is in contact with the first region, and is not in contact with the second region.

Advantages of the Invention

With the electronic device of the present disclosure, it is possible to achieve an improvement in the reliability of the electronic device. Also, with the manufacturing method of the present disclosure, it is possible to manufacture an electronic device with improved reliability.

MODE FOR CARRYING OUT THE INVENTION

Figure 1:
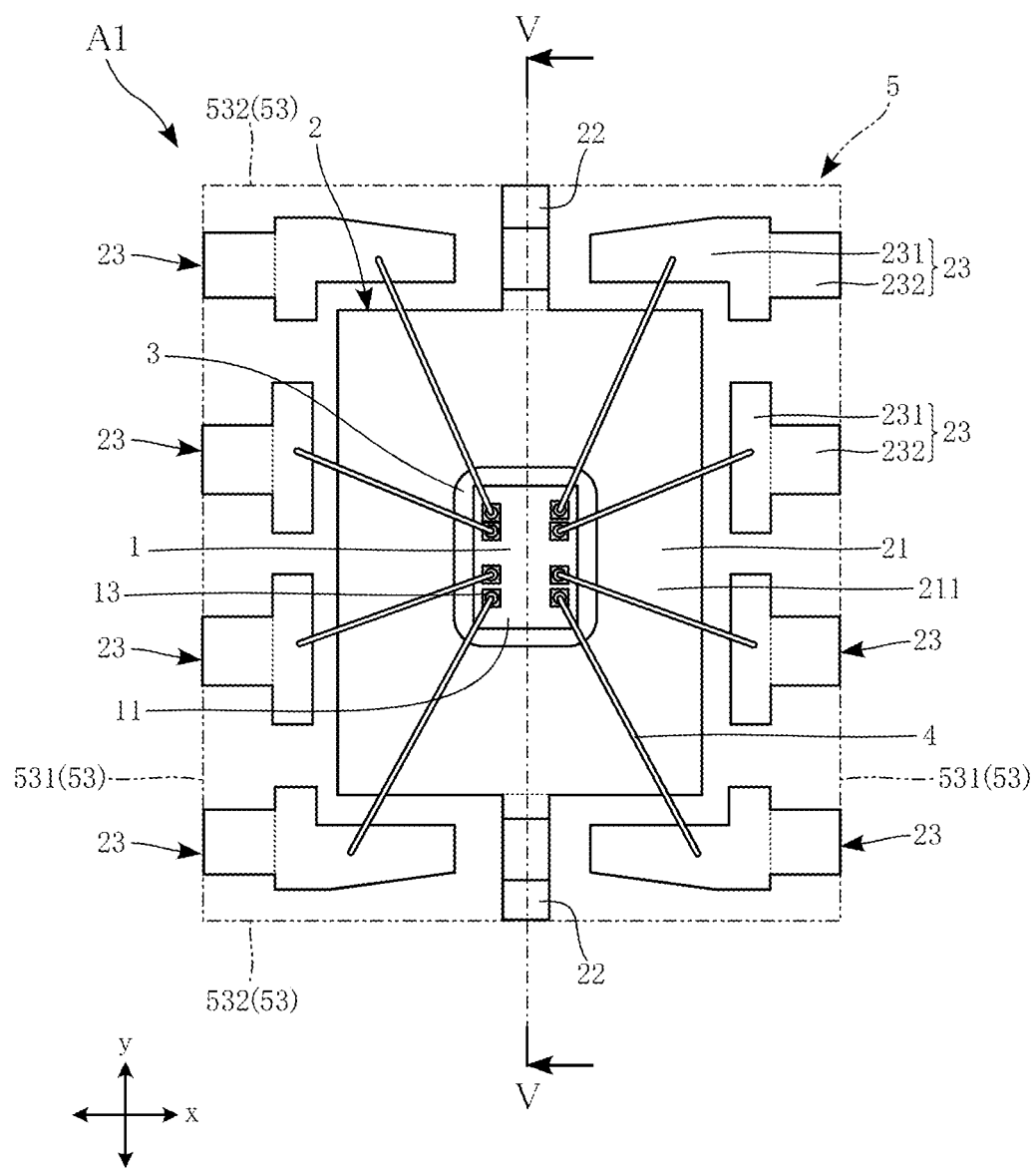
FIG. 1 is a plan view of an electronic device according to a first embodiment.

Electronic devices according to preferred embodiments of the present disclosure will be described below with reference to the drawings. Constituent elements that are the same or similar are given the same reference numerals, and a redundant description will be omitted.

FIGS. 1 to 7 show an electronic device according to a first embodiment. An electronic device A1 according to the first embodiment includes an electronic component 1, a lead frame 2, a bonding material 3, connecting members 4, and a resin member 5.

Figure 2:
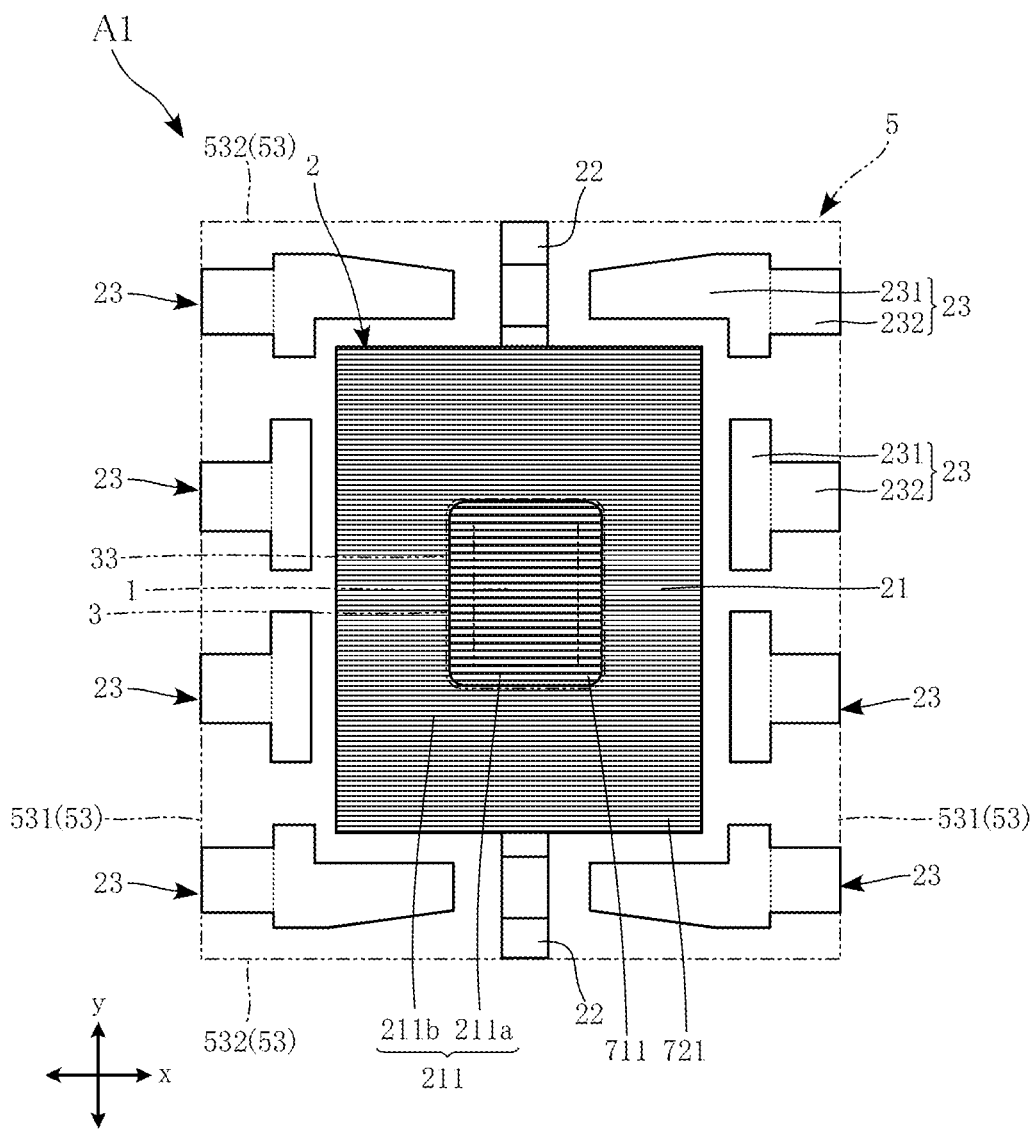
FIG. 2 is a diagram corresponding to the plan view of FIG. 1 in which an electronic component and a bonding material are indicated by imaginary lines, and an illustration of connecting members is omitted.
Figure 3:
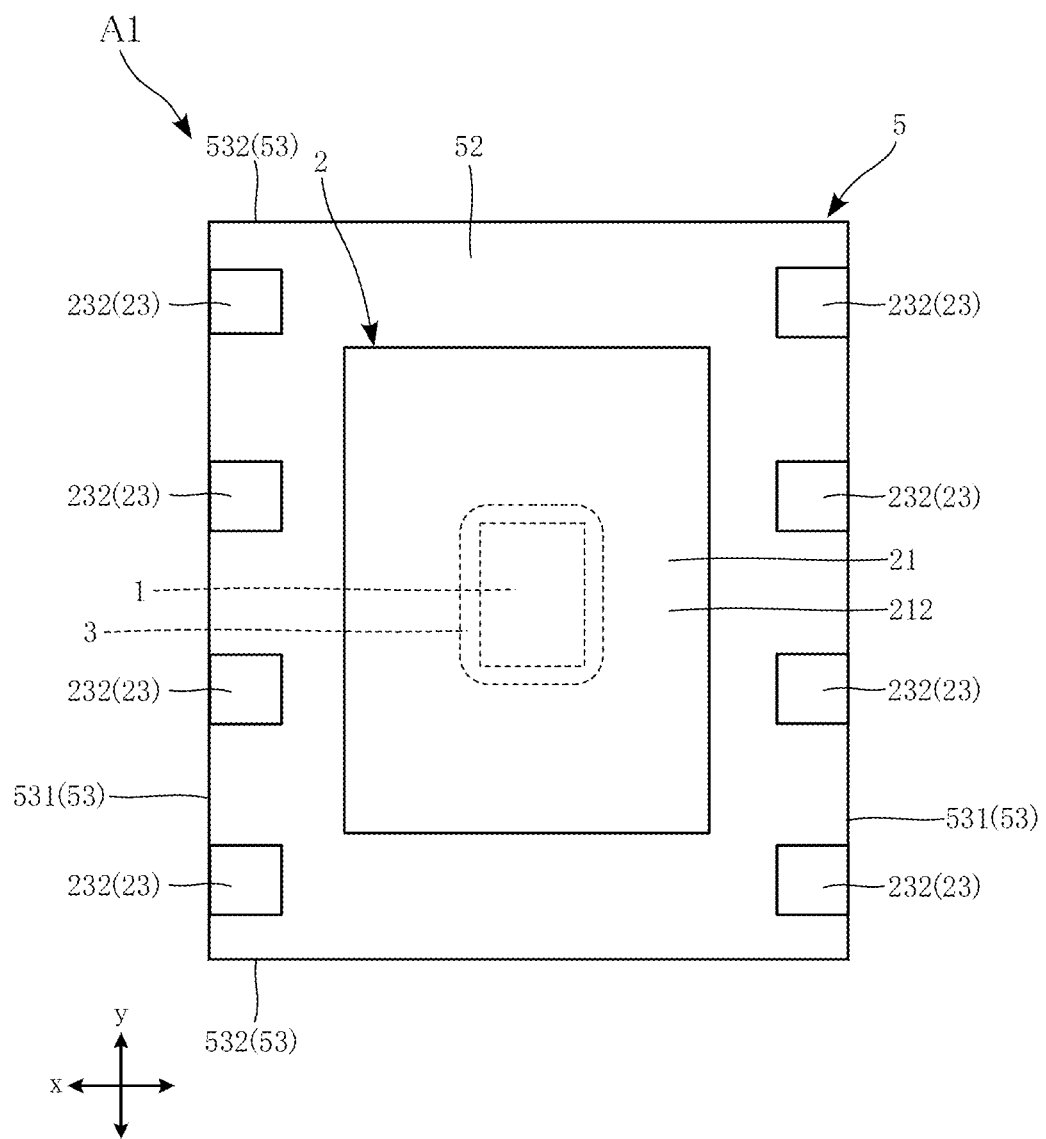
FIG. 3 is a bottom view of the electronic device according to the first embodiment.
Figure 4:
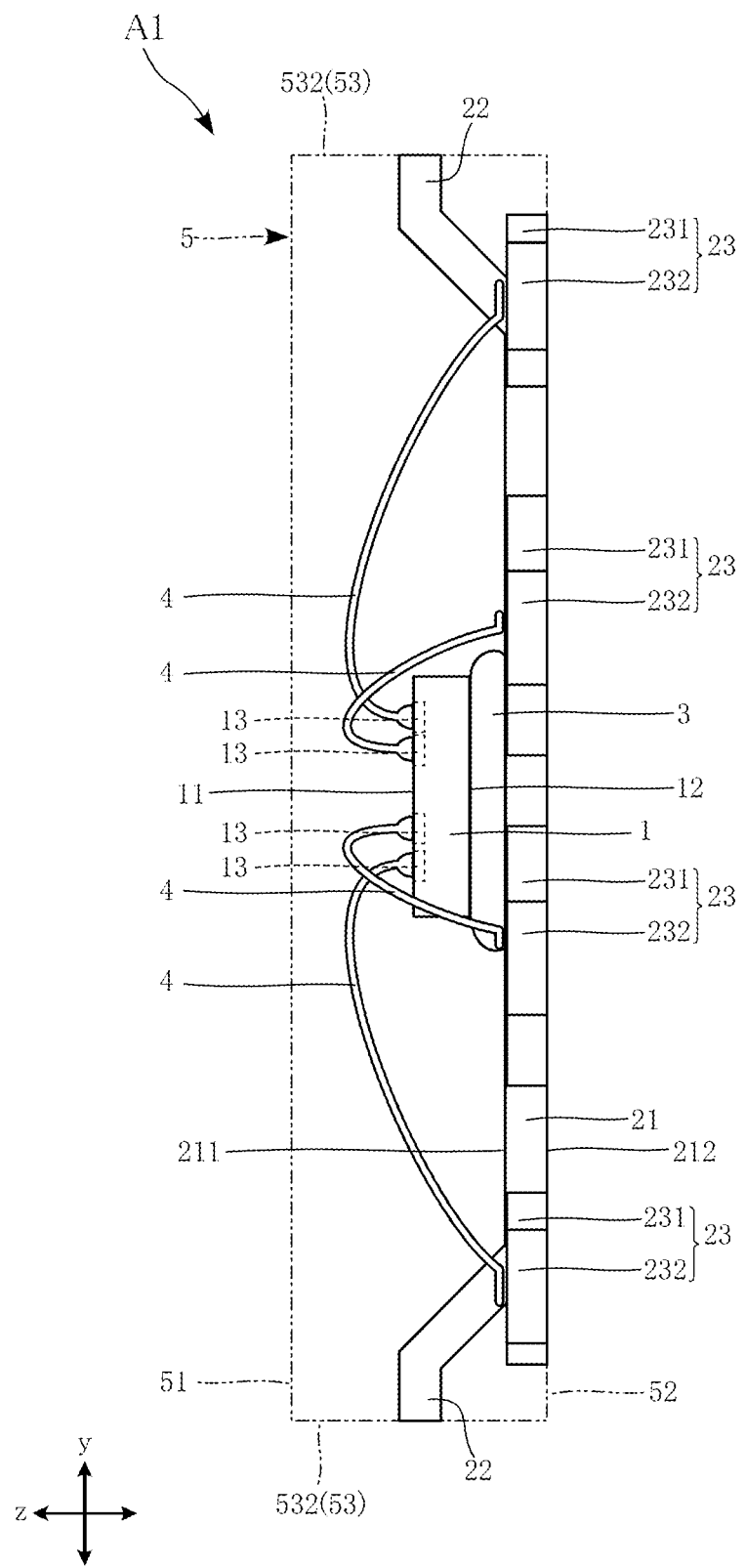
FIG. 4 is a side view (right side view) of the electronic device according to the first embodiment.
Figure 5:
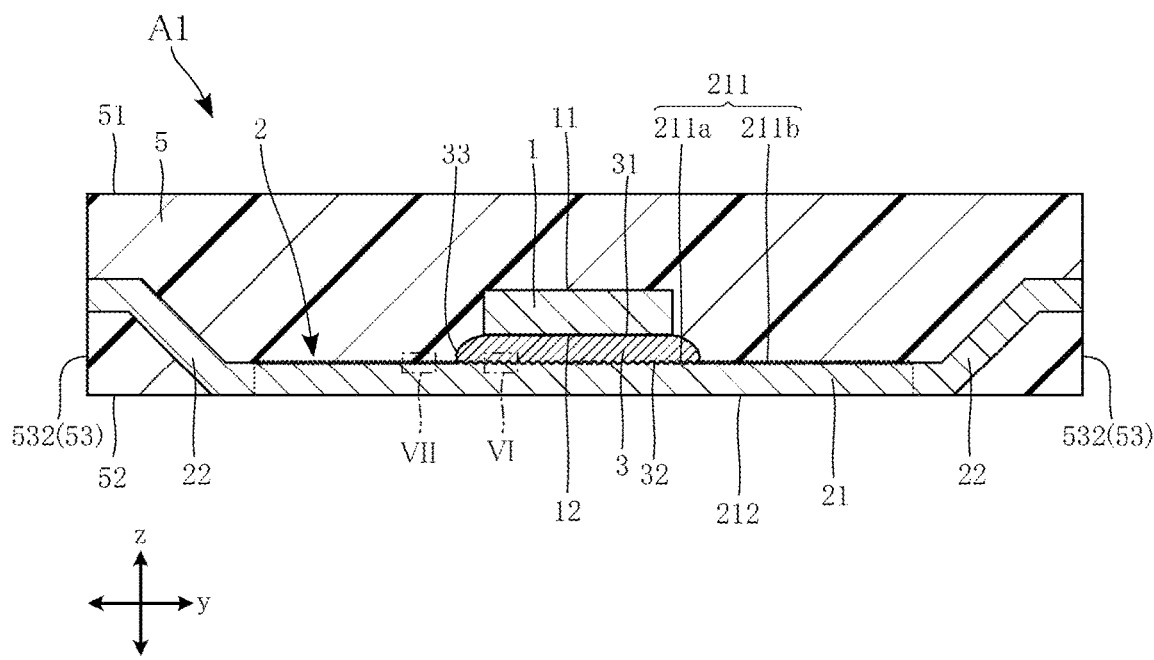
FIG. 5 is a cross-sectional view taken along the line V-V shown in FIG. 1.
Figure 6:
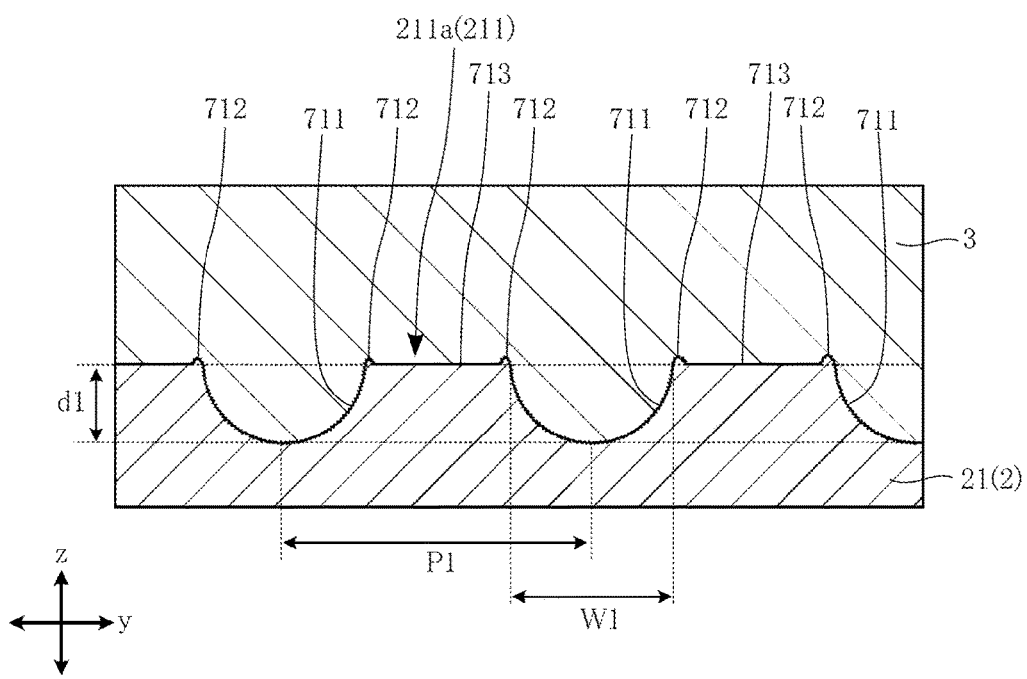
FIG. 6 is a partially enlarged cross-sectional view of a region VI shown in FIG. 5.
Figure 7:
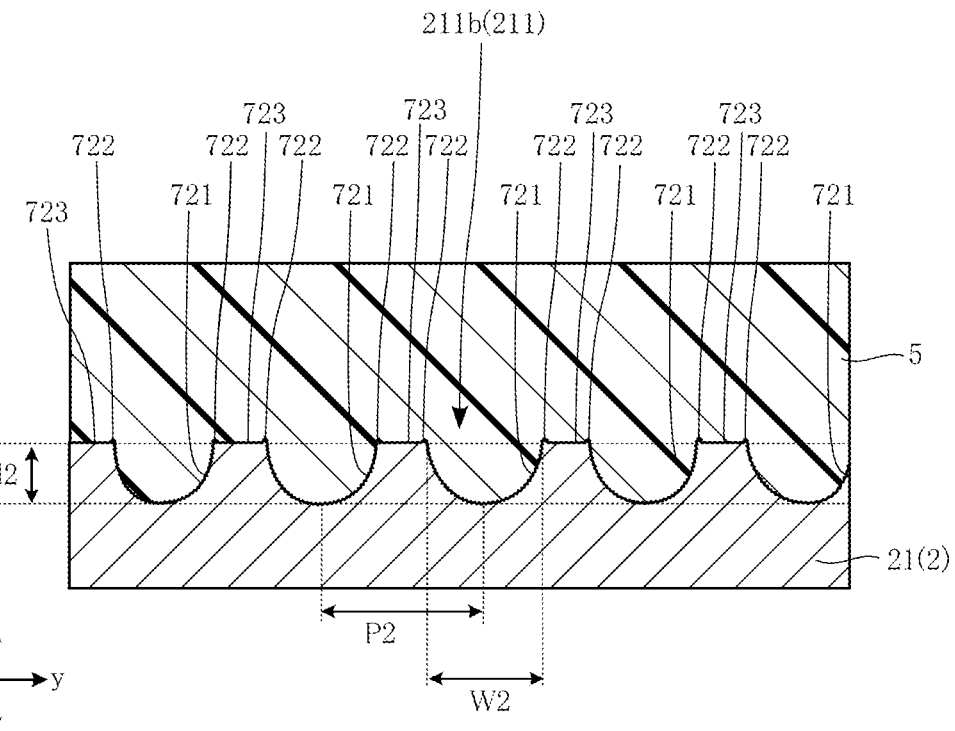
FIG. 7 is a partially enlarged cross-sectional view of a region VII shown in FIG. 5.

FIG. 1 is a plan view of the electronic device A1 in which the resin member 5 is indicated by an imaginary line (a dashed-and-double-dotted line). FIG. 2 is a diagram corresponding to the plan view of FIG. 1 in which an illustration of the connecting members 4 is omitted, and the electronic component 1 is indicated by an imaginary line. FIG. 3 is a bottom view of the electronic device A1. FIG. 4 is a side view (right side view) of the electronic device A1. FIG. 5 is a cross-sectional view taken along the line V-V shown in FIG. 1. FIG. 6 is a partially enlarged cross-sectional view of a region VI shown in FIG. 5. FIG. 7 is a partially enlarged cross-sectional view of a region VII shown in FIG. 5.

For the sake of convenience of the description, in FIGS. 1 to 7, three directions that are orthogonal to each other are defined as x direction, y direction, and z direction. The z direction is the thickness direction of the electronic device A1. The x direction is the left-right direction of the plan view of the electronic device A1 (see FIG. 1). The y direction is the up-down direction of the plan view of the electronic device A1 (see FIG. 1). In the description given below, one side in the z direction (the upper side of the cross-sectional view shown in FIG. 5) may be referred to as "upper side", and the other side in the z direction (the lower side of the cross-sectional view shown in FIG. 5) may be referred to as "lower side", but it is not intended to limit the orientation of the electronic device A1. The z direction corresponds to "first direction" recited in the appended claims.

The electronic device A1 is a surface mount packaged electronic device. As shown in FIGS. 1 to 7, the electronic device A1 is configured in a package in which lead wires (terminal lead portions 23, which will be described later) do not protrude from the resin member 5 as viewed in a plan view.

The electronic component 1 serves as the functional center of the electronic device A1. The electronic component 1 is, for example, an integrated circuit (IC) such as an LSI (Large Scale Integration). The electronic component 1 is not limited to an IC, and may be a voltage controlling element such as a LDO (Low Drop Out), an amplifying element such as an operational amplifier, a discrete component such as a transistor, a diode, an LED, or a terahertz element, or the like. Alternatively, the electronic component 1 may be, for example, a resistor, an inductor, a capacitor, or the like.

The electronic component 1 has, for example, a rectangular shape as viewed in a plan view. The electronic component 1 is bonded to a portion of the lead frame 2 (a die pad portion 21, which will be described later) by using the bonding material 3. As shown in FIGS. 4 and 5, the electronic component 1 includes an obverse surface 11 and a reverse surface 12.

The obverse surface 11 and the reverse surface 12 are spaced apart from each other in the z direction. The obverse surface 11 serves as an upper surface of the electronic component 1, and the reverse surface 12 serves as a lower surface of the electronic component 1. The obverse surface 11 and the reverse surface 12 are both flat.

The electronic component 1 includes a plurality of electrode pads 13. The electrode pads 13 serve as terminals of the electronic component 1. The electrode pads 13 are exposed from the obverse surface 11.

The lead frame 2 is mounted on a circuit board such as an electronic device, and thereby serves as a conduction path between the electronic component 1 and the circuit board. The lead frame 2 supports the electronic component 1. The lead frame 2 includes a conductive material. The conductive material is, for example, a metal that contains Cu (copper). Specifically, the lead frame 2 may be a metal plate made of Cu or a Cu alloy, or an organic substrate with a Cu layer formed on a surface thereof. The surface layer of the lead frame 2 is made of a metal that contains Cu. The lead frame 2 corresponds to "support member" recited in the appended claims. As shown in FIG. 1, the lead frame 2 includes a die pad portion 21, a plurality of hanging lead portions 22, and a plurality of terminal lead portions 23. In the electronic device A1, as shown in FIG. 1, the lead frame 2 includes one die pad portion 21, two hanging lead portions 22, and eight terminal lead portions 23.

As shown in FIGS. 1 and 5, the electronic component 1 is mounted on the die pad portion 21 by being fixedly attached to the die pad portion 21 via the bonding material 3. The die pad portion 21 has, for example, a rectangular shape as viewed in a plan view. As shown in FIG. 5, the die pad portion 21 includes an obverse surface 211 and a reverse surface 212.

The obverse surface 211 and the reverse surface 212 are spaced apart from each other in the z direction. The obverse surface 211 serves as an upper surface of the die pad portion 21. The reverse surface 212 serves as a lower surface of the die pad portion 21. As shown in FIGS. 3 to 5, the reverse surface 212 is exposed from the resin member 5. The reverse surface 212 may be covered with the resin member 5. However, when the reverse surface 212 is exposed from the resin member 5, the effect of dissipating heat from the electronic component 1 increases. As shown in FIG. 2, the obverse surface 211 includes a first region 211a and a second region 211b. A detailed description of the first region 211a and the second region 211b will be given later. The obverse surface 211 corresponds to "mount surface" recited in the appended claims.

As shown in FIGS. 1 and 5, the plurality of hanging lead portions 22 are connected to the die pad portion 21. As viewed in a plan view, the plurality of hanging lead portions 22 extend in the y direction from opposing end edges of the die pad portion 21 in the y direction. Each hanging lead portion 22 is partially bent in the z direction. In the example shown in FIG. 5, an end edge of each hanging lead portion 22 that is connected to the die pad portion 21 in the y direction is positioned lower in the z direction than the other end edge of the hanging lead portion 22 that is on the opposite side, but it may be positioned higher in the z direction.

The plurality of terminal lead portions 23 are partially exposed from the resin member 5 and serve as external terminals of the electronic device A1. As shown in FIG. 1, the terminal lead portions 23 are spaced apart from the die pad portion 21 and the hanging lead portions 22. As shown in FIGS. 1 to 4, each terminal lead portion 23 includes a pad portion 231 and a terminal portion 232.

One end of a connecting member 4 is bonded to the pad portion 231. The terminal portion 232 is partially exposed from the resin member 5. In each terminal lead portion 23, the pad portion 231 and the terminal portion 232 are connected to each other, and are unitarily formed as a single piece.

As shown in FIGS. 4 and 5, the bonding material 3 is provided between the electronic component 1 and the die pad portion 21 (the lead frame 2) to bond them. The material that constitutes the bonding material 3 contains a first composition in the form of a solid. The first composition is, for example, solder. The solder may be lead-free solder or lead-containing solder. The bonding material 3 may be a conductive bonding material other than solder. Alternatively, the bonding material 3 may be an insulating bonding material, instead of the conductive bonding material. The first composition is a material that undergoes a phase transition to a liquid by being heated.

As shown in FIG. 5, the bonding material 3 includes a first surface 31, a second surface 32, and a third surface 33. The first surface 31 faces upward in the z direction, and is in contact with the electronic component 1. The second surface 32 faces downward in the z direction, and is in contact with the die pad portion 21 of the lead frame 2. In the present embodiment, the second surface 32 substantially completely overlaps the first region 211a as viewed in a plan view. The third surface 33 is connected to the first surface 31 and the second surface 32. The third surface 33 is a curved surface. In the present embodiment, as shown in FIG. 2, a portion of the third surface 33 (outer periphery as viewed in a plan view) overlaps the second region 211b as viewed in a plan view. The third surface 33 does not necessarily need to overlap the second region 211b as viewed in a plan view.

The plurality of connecting members 4 electrically connect the electronic component 1 and the lead frame 2 (the terminal lead portions 23). The connecting members 4 are, for example, bonding wires. The connecting members 4 are not limited to bonding wires, and may be bonding ribbons or plate-like clip members. The material that constitutes the connecting members 4 may be any one of Cu, Au (gold), and Al (aluminum).

In each connecting member 4, one end is bonded to one of the electrode pads 13 of the electronic component 1, and the other end is bonded to the pad portion 231 of one of the terminal lead portions 23. In the present embodiment, each connecting member 4 is a bonding wire, with one end being bonded to an electrode pad 13 through ball bonding and the other end being bonded to a pad portion 231 through wedge bonding. Alternatively, one end may be bonded to a pad portion 231 through ball bonding, and the other end may be bonded to an electrode pad 13 through wedge bonding.

The resin member 5 serves as a sealing material in the electronic device A1. As shown in FIGS. 4 and 5, the resin member 5 covers the electronic component 1, a portion of the lead frame 2, the bonding material 3, and the plurality of connecting members 4. The material that constitutes the resin member 5 contains a second composition in the form of a solid. The second composition is, for example, an epoxy resin. The resin member 5 has, for example, a rectangular shape as viewed in a plan view. As shown in FIGS. 1 to 5, the resin member 5 includes a resin obverse surface 51, a resin reverse surface 52, and a plurality of resin side surfaces 53.

The resin obverse surface 51 and the resin reverse surface 52 are spaced apart from each other in the z direction. The resin obverse surface 51 serves as an upper surface of the resin member 5. The resin reverse surface 52 serves as a lower surface of the resin member 5. As shown in FIG. 3, a portion of the lead frame 2 (a portion of the reverse surface 212 of the die pad portion 21 and the terminal portions 232) is exposed from the resin reverse surface 52. The plurality of resin side surfaces 53 are connected to both the resin obverse surface 51 and the resin reverse surface 52, and are sandwiched between the resin obverse surface 51 and the resin reverse surface 52 in the z direction. The resin member 5 includes a pair of resin side surfaces 531 that are spaced apart from each other in the x direction and a pair of resin side surfaces 532 that are spaced apart from each other in the y direction. In the present embodiment, in the terminal portion 232 of each terminal lead portion 23, a portion of the terminal portion 232 is exposed from the resin reverse surface 52 and is also exposed from one of the pair of resin side surfaces 531.

Next, the first region 211a and the second region 211b included in the obverse surface 211 of the die pad portion 21 will be described.

As shown in FIG. 5, the first region 211a is in contact with the bonding material 3. The first region 211a has, for example, a rectangular shape as viewed in a plan view. The electronic component 1 overlaps the first region 211a as viewed in a plan view. As shown in FIG. 6, the first region 211a includes a plurality of grooves 711, a plurality of raised portions 712, and a plurality of intervening portions 713.

The plurality of grooves 711 are recessed toward the lower side in the z direction from the intervening portions 713. The plurality of grooves 711 may be formed through, for example, laser processing in which laser light is applied thereto. The method for forming the plurality of grooves 711 is not limited to laser processing, and may be, for example, etching or the like. The plurality of grooves 711 are arranged in an arrangement pattern described below. The grooves 711 extend linearly in a direction perpendicular to the z direction. In the present embodiment, as shown in FIG. 2, the grooves 711 extend in the x direction, but may extend in the y direction. The plurality of grooves 711 are arranged in parallel to each other. Each groove 711 has a width W1 (see FIG. 6) of, for example, about 20 to 40 μm. Each groove 711 has a depth d1 (see FIG. 6) of, for example, about 5 to 20 μm. A spacing P1 between two adjacent grooves 711 (see FIG. 6) is, for example, about 30 to 200 μm. The spacing P1 refers to the distance between the centers of two adjacent grooves 711 in the width direction.

As shown in FIG. 6, the plurality of raised portions 712 are provided such that each raised portion 712 is connected to one of two end edges of one groove 711 in the y direction. One of two end edges of each raised portion 712 in the y direction is connected to one of the grooves 711 and the other end edge is connected to one of the intervening portions 713. The raised portions 712 protrude toward the upper side in the z direction from the intervening portions 713.

Figure 8:
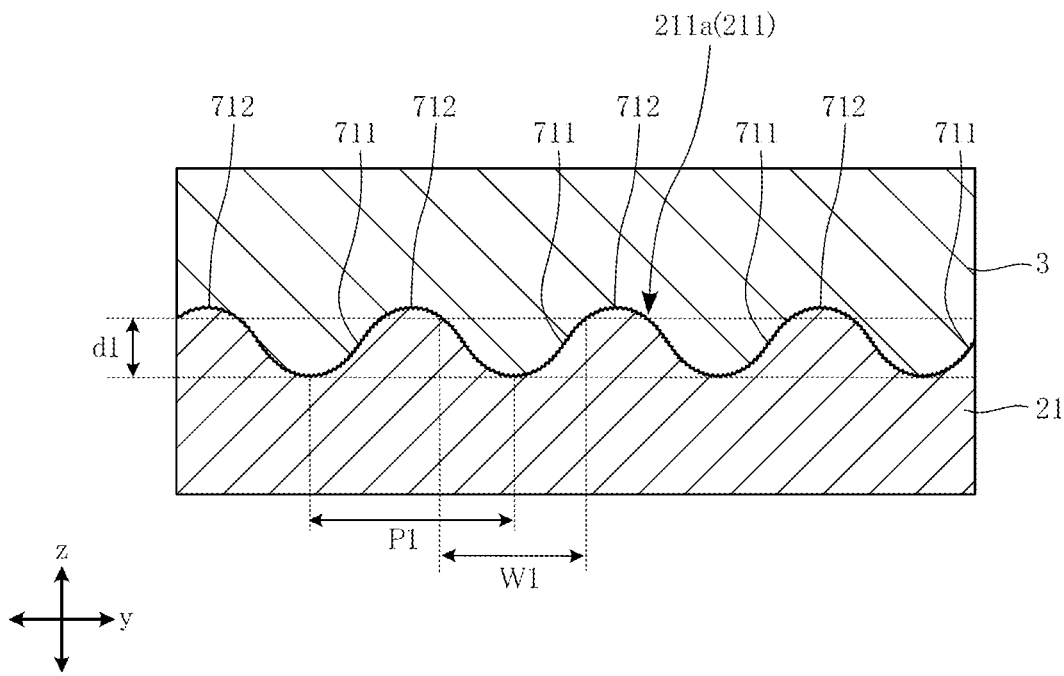
FIG. 8 is a partially enlarged cross-sectional view of a first region according to a variation.

As shown in FIG. 6, each of the plurality of intervening portions 713 is provided between two adjacent grooves 711. Each intervening portion 713 is interposed between two adjacent grooves 711 in the y direction via the raised portions 712. The intervening portions 713 are formed as a result of laser light being not applied during the formation of the grooves 711. As shown in FIG. 8, the intervening portions 713 may not be formed depending on the width W1 and the spacing P1 between the plurality of grooves 711 formed by laser processing. For example, if the spacing P1 is smaller than the width W1 of the grooves 711, the intervening portions 713 are not formed. In this case, as shown in FIG. 8, each raised portion 712 is provided between two adjacent grooves 711, and both end edges of the raised portion 712 in the y direction are connected to the grooves 711.

The first region 211a is roughened due to the plurality of grooves 711, the plurality of raised portions 712, and the plurality of intervening portions 713. Accordingly, the first region 211a is a rough surface. Also, the surface of each of the plurality of grooves 711 and the surface of each of the plurality of raised portions 712 have fine irregularities that are formed through laser processing. Accordingly, the surface of each of the plurality of grooves 711 and the surface of each of the plurality of raised portions 712 are rough surfaces due to the fine irregularities. The surface of each of the plurality of grooves 711 and the surface of each of the plurality of raised portions 712 have a surface roughness finer than that of the first region 211a.

The first region 211a has a lyophilicity for the first composition (for example, solder) in the form of a liquid. In the present embodiment, due to the plurality of grooves 711 formed in the first region 211a, the first region 211a has a lyophilicity for the first composition in the form of a liquid. Also, the first region 211a where the plurality of grooves 711 are formed has a higher lyophilicity for the first composition in the form of a liquid than the first region 211a where the plurality of grooves 711 are not formed.

As shown in FIG. 5, the second region 211b is not in contact with the bonding material 3, but is in contact with the resin member 5. The second region 211b has, for example, a rectangular annular shape as viewed in a plan view. The second region 211b surrounds the first region 211a as viewed in a plan view. The second region 211b is configured such that an inner edge thereof is in contact with an outer edge of the first region 211a as viewed in a plan view. As shown in FIG. 7, the second region 211b includes a plurality of grooves 721, a plurality of raised portions 722, and a plurality of intervening portions 723.

As shown in FIG. 7, the plurality of grooves 721 are recessed toward the lower side in the z direction from the intervening portions 723. The plurality of grooves 721 may be formed through, for example, laser processing. The method for forming the plurality of grooves 721 is not limited to laser processing, and may be, for example, etching or the like. The plurality of grooves 721 are arranged in an arrangement pattern described below. The grooves 721 extend linearly in a direction perpendicular to the z direction. In the present embodiment, as shown in FIG. 2, the grooves 721 extend in the x direction, but may extend in the y direction. The plurality of grooves 721 are arranged in parallel to each other. Each groove 721 has a width W2 (see FIG. 7) of, for example, about 5 to 10 μm. Each 721 has a depth d2 (see FIG. 7) of, for example, about 5 to 10 μm. A spacing P2 between two adjacent grooves 721 (see FIG. 7) is, for example, about 10 to 20 μm. The spacing P2 refers to the distance between the centers of two adjacent grooves 721 in the width direction.

As shown in FIG. 7, the plurality of raised portions 722 are provided such that each raised portion 722 is connected to one of two end edges of one groove 721 in the y direction. One of two end edges of each raised portion 722 in the y direction is connected to one of the grooves 721 and the other end edge is connected to one of the intervening portions 723. The raised portions 722 protrude toward the upper side in the z direction from the intervening portions 723.

As shown in FIG. 7, each of the plurality of intervening portions 723 is provided between two adjacent grooves 721. Each intervening portion 723 is interposed between two adjacent grooves 721 in the y direction via the raised portions 722. The intervening portions 723 are formed as a result of laser light being not applied during the formation of the grooves 721. As with the intervening portions 713, the intervening portions 723 may not be formed (see FIG. 8) depending on the width W2 and the spacing P2 between the plurality of grooves 721 formed by laser processing. For example, if the spacing P2 is smaller than the width W2 of each groove 721, the intervening portions 723 are not formed. In this case, each raised portion 722 is provided between two adjacent grooves 721, and both end edges of the raised portion 722 in the y direction are connected to the grooves 721.

The second region 211b is roughened due to the plurality of grooves 721, the plurality of raised portions 722, and the plurality of intervening portions 723. Accordingly, the second region 211b is a rough surface. Also, the surface of each of the plurality of grooves 721 and the surface of each of the plurality of raised portions 722 have fine irregularities that are formed through laser processing. Accordingly, the surface of each of the plurality of grooves 721 and the surface of each of the plurality of raised portions 722 are rough surfaces due to the fine irregularities. The surface of each of the plurality of grooves 721 and the surface of each of the plurality of raised portions 722 have a surface roughness finer than that of the second region 211b.

The second region 211b has a lyophilicity for the second composition (for example, an epoxy resin) in the form of a liquid. In the present embodiment, due to the plurality of grooves 721 formed in the second region 211b, the second region 211b has a lyophilicity for the second composition in the form of a liquid.

In the obverse surface 211 of the die pad portion 21, the first region 211a has a higher lyophilicity for the first composition in the form of a liquid than the second region 211b. In the present embodiment, the first composition is solder, and thus the first region 211a has a solder wettability higher than that of the second region 211b. For example, by adjusting the width W1, the spacing P1, and the depth d1 of the grooves 711 formed in the first region 211a and the width W2, the spacing P2, and the depth d2 of the grooves 721 formed in the second region 211b, a difference is generated between the lyophilicity for the first composition in the form of a liquid and the lyophilicity for the second composition in the form of a liquid. In the electronic device A1, for example, the width W1 of the grooves 711 is adjusted to be larger than the width W2 of the grooves 721, and the spacing P1 between grooves 711 is adjusted to be larger than the spacing P2 between grooves 721. In doing so, the lyophilicity of the first region 211a for the first composition in the form of a liquid is higher than the lyophilicity of the second region 211b for the first composition in the form of a liquid.

A method for manufacturing the electronic device A1 will be described next with reference to FIGS. 9 to 13. FIGS. 9 to 13 are plan views illustrating the steps of a method for manufacturing the electronic device A1.

Figure 9:
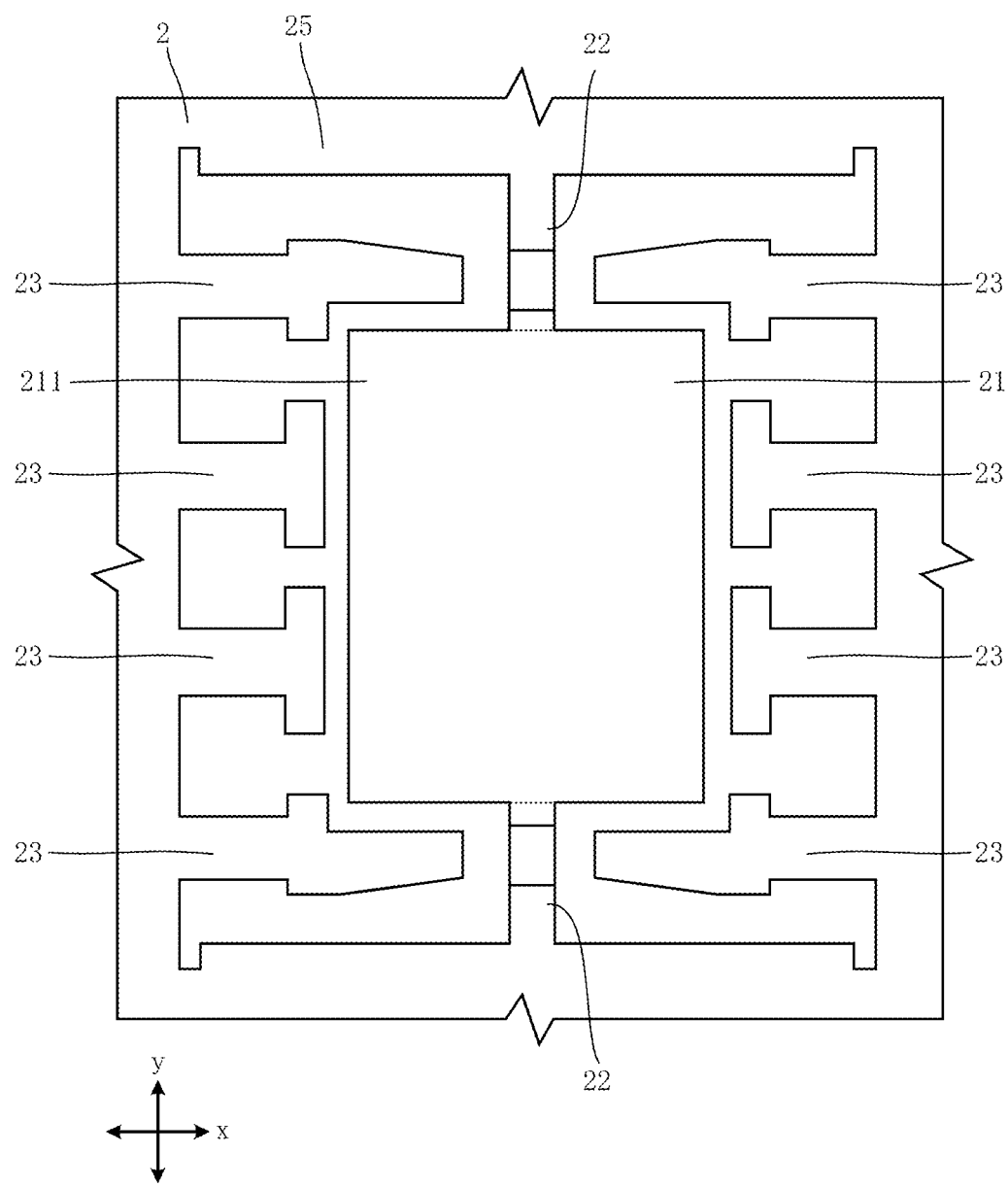
FIG. 9 is a plan view illustrating a step of a method for manufacturing an electronic device according to the first embodiment.

First, as shown in FIG. 9, a lead frame 2 is prepared. This step corresponds to "first step" recited in the appended claims. The lead frame 2 to be prepared may be formed by, for example, punching or bending a copper plate. As shown in FIG. 9, the lead frame 2 at this time includes a die pad portion 21, a plurality of hanging lead portions 22, a plurality of terminal lead portions 23, and a plurality of tie bars 25. The die pad portion 21, the plurality of hanging lead portions 22, and the plurality of terminal lead portions 23 are connected by the plurality of tie bars 25.

Figure 10:
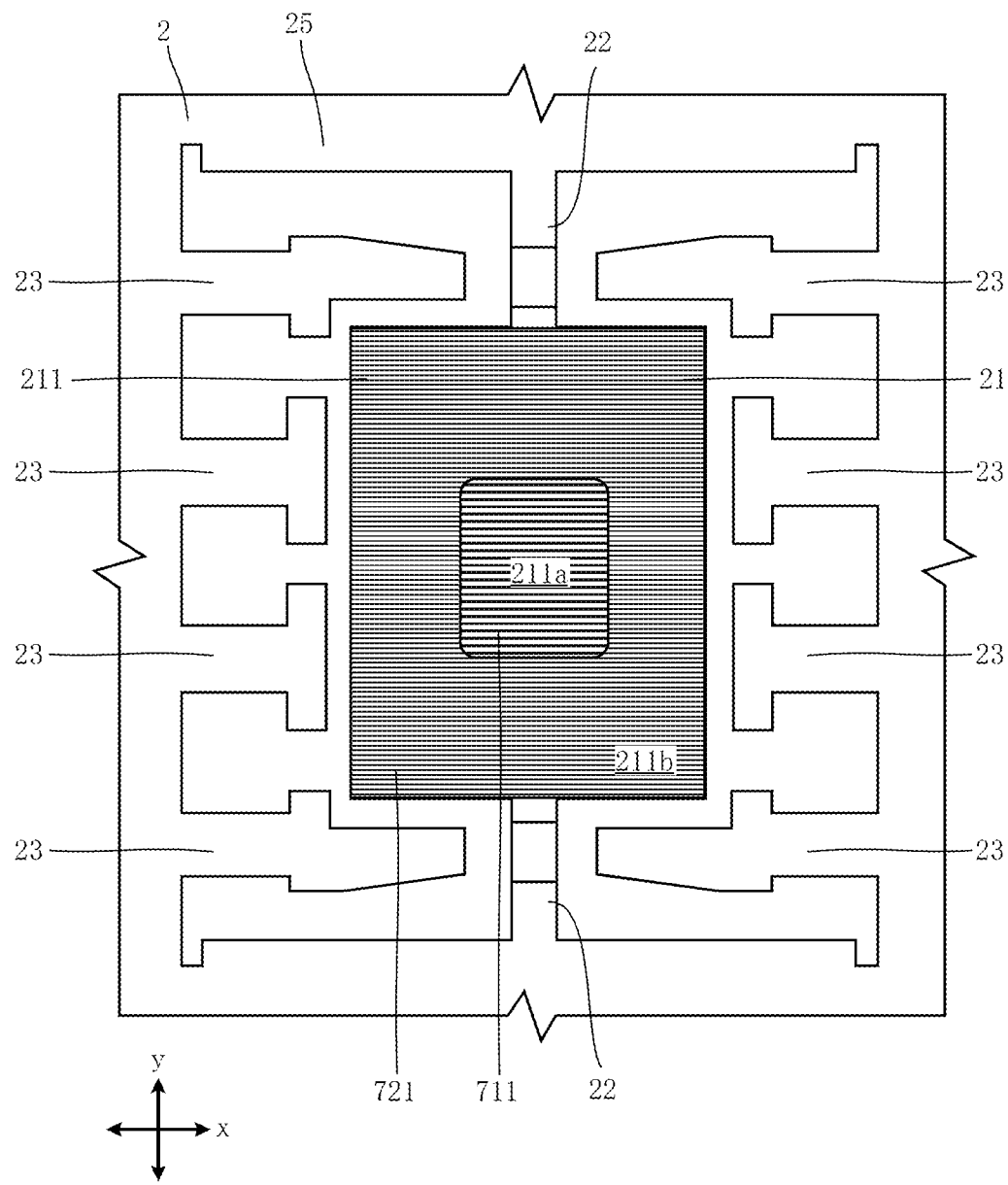
FIG. 10 is a plan view illustrating a step of the method for manufacturing an electronic device according to the first embodiment.

Next, as shown in FIG. 10, a first region 211a and a second region 211b are formed in the die pad portion 21 of the lead frame 2. This step corresponds to "second step" recited in the appended claims. The first region 211a is a region where a bonding material 3 is formed and an electronic component 1 is mounted. The second region 211b is a region where the bonding material 3 is not formed. Specifically, laser light is applied to the obverse surface 211 of the die pad portion 21 of the lead frame 2 so as to excavate the obverse surface 211 and form a plurality of grooves 711 and a plurality of grooves 721. The application of laser light is performed using a well-known laser application apparatus. The plurality of grooves 711 are formed in, for example, a rectangular region as viewed in a plan view. The region where the plurality of grooves 711 are formed is the first region 211a. The plurality of grooves 721 are formed in a rectangular annular region as viewed in a plan view that surrounds the region (the first region 211a) where the plurality of grooves 711 are formed. The region where the plurality of grooves 721 are formed is the second region 211b. The arrangement pattern of the plurality of grooves 711 and the arrangement pattern of the plurality of grooves 721 have already been described above. The first region 211a and the second region 211b may be formed in any order, and may be formed simultaneously. In the drawings (FIGS. 11 to 13) that are to be referred to in the following description, an illustration of the grooves 711 and 721 is omitted.

Figure 11:
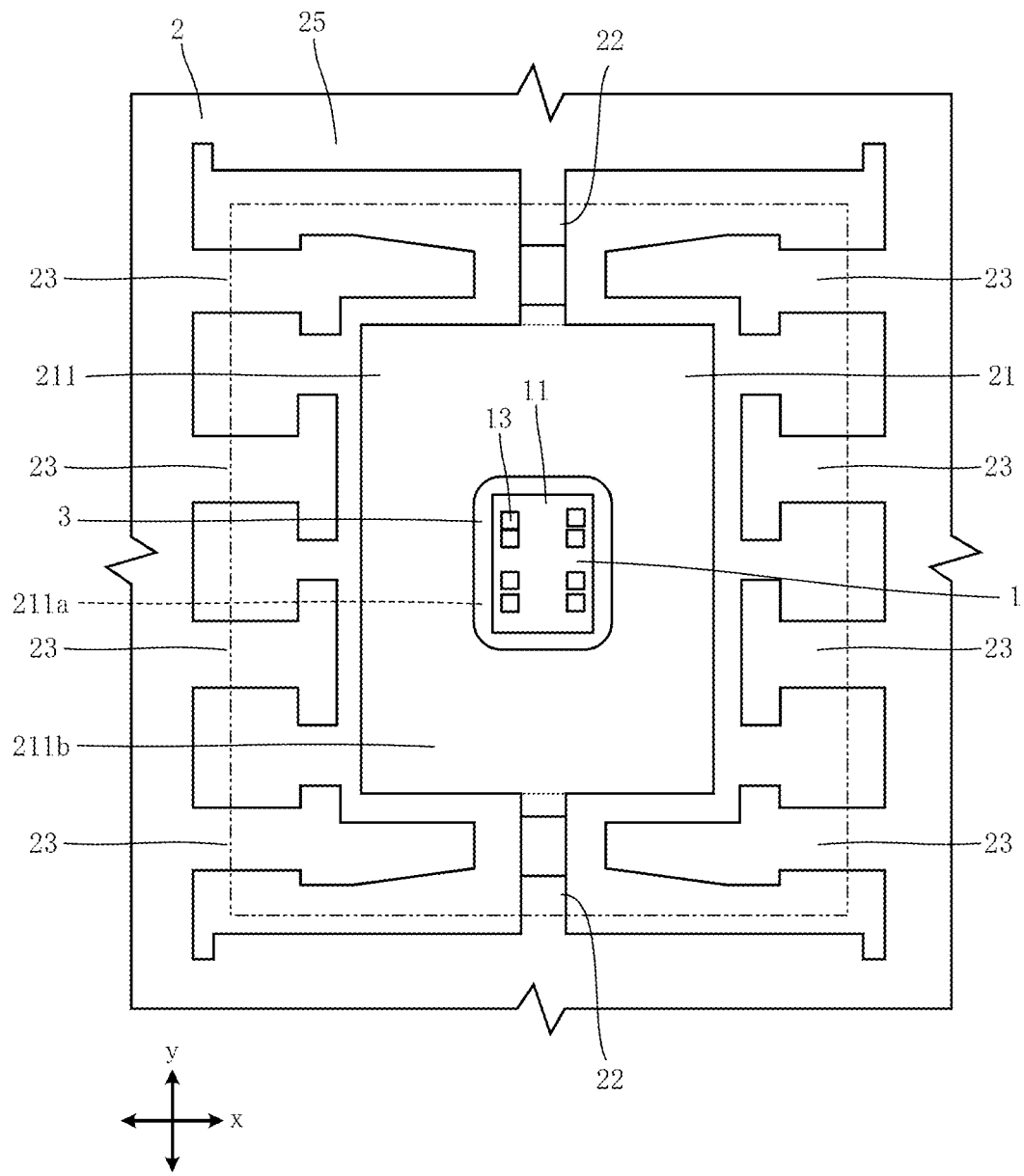
FIG. 11 is a plan view illustrating a step of the method for manufacturing an electronic device according to the first embodiment.

Next, as shown in FIG. 11, a bonding material 3 in the form of a paste is applied to the region (the first region 211a) where the plurality of grooves 711 are formed, and an electronic component 1 is placed on the bonding material 3 in the form of a paste. The step of applying a bonding material 3 in the form of a paste corresponds to "third step" recited in the appended claims, and the step of placing an electronic component 1 on the bonding material 3 in the form of a paste corresponds to "fourth step" recited in the appended claims. The material that constitutes the bonding material 3 is a first composition. The first composition is, for example, solder. Accordingly, a solder paste is applied to the first region 211a.

Next, reflow processing is performed. This step corresponds to "fifth step" recited in the appended claims. In the reflow processing, due to heat during the reflow processing, the bonding material 3 in the form of a paste turns into a liquid, and thus the flowability increases. The bonding material 3 in the form of a liquid spreads over the first region 211a. This is because, due to the plurality of grooves 711, the first region 211a has a lyophilicity for the bonding material 3 in the form of a liquid. At this time, the bonding material 3 in the form of a liquid spreads uniformly over the first region 211a due to the lyophilicity of the first region 211a for the bonding material 3 in the form of a liquid. Also, the bonding material 3 in the form of a liquid remains in the first region 211a, and does not flow out to the second region 211b. This is because the lyophilicity of the second region 211b for the bonding material 3 in the form of a liquid is lower than that of the first region 211a, and thus a force that causes the bonding material 3 in the form of a liquid to remain in the first region 211a acts, as a result of which, the likelihood of the bonding material 3 flowing to the second region 211b is suppressed. After that, through cooling during the reflow processing, the bonding material 3 in the form of a liquid solidifies and turns into a solid. As a result, the electronic component 1 is bonded to the lead frame 2 (the die pad portion 21) by the bonding material 3 in the form of a solid.

Figure 12:
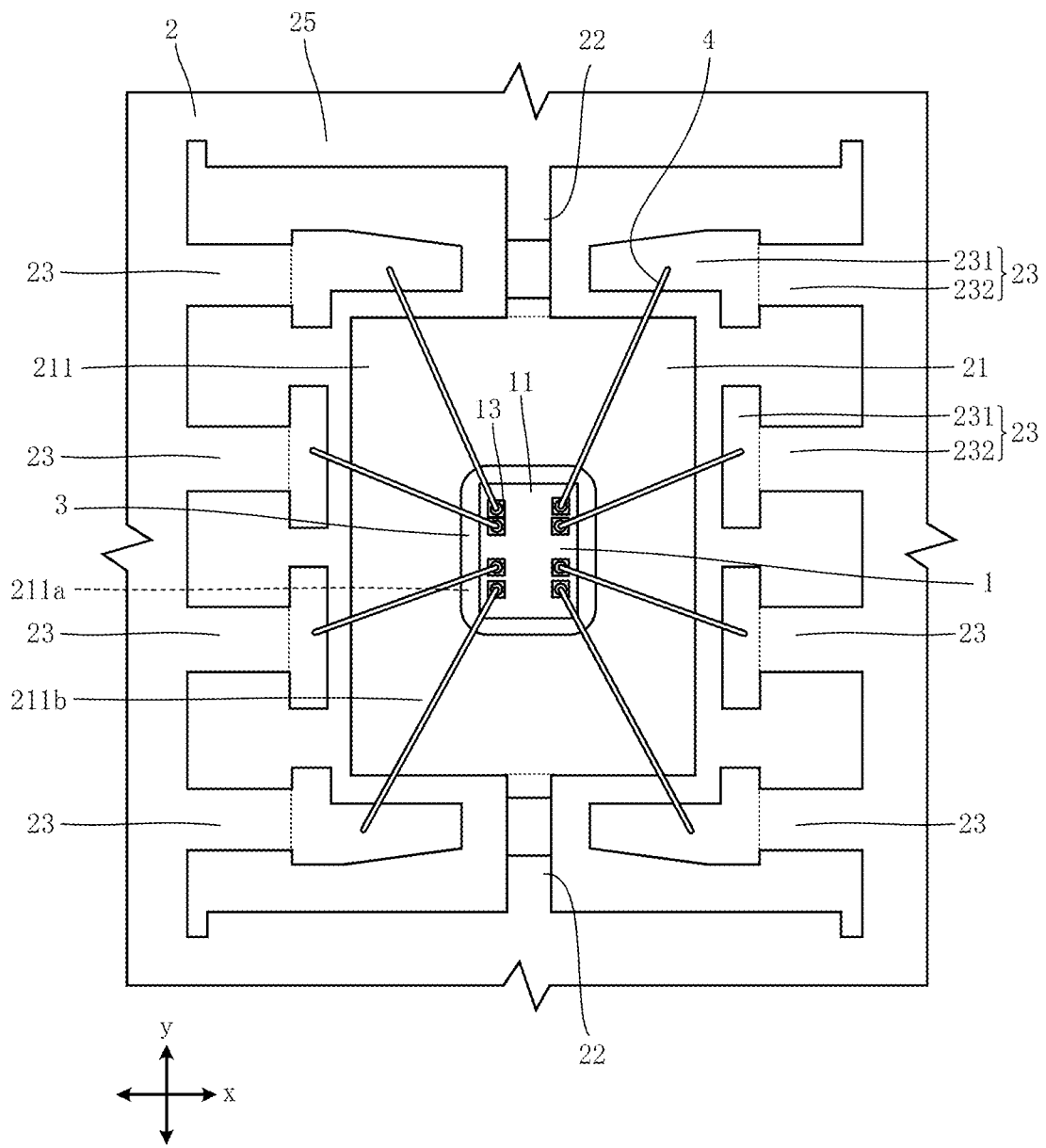
FIG. 12 is a plan view illustrating a step of the method for manufacturing an electronic device according to the first embodiment.

Next, as shown in FIG. 12, electrode pads 13 provided in the obverse surface 11 of the electronic component 1 and pad portions 231 provided in the terminal lead portions 23 of the lead frame 2 are electrically connected using connecting members 4. The connecting members 4 are, for example, bonding wires, and the connecting members 4 are formed by using, for example, a wire bonding apparatus that includes a capillary.

Figure 13:
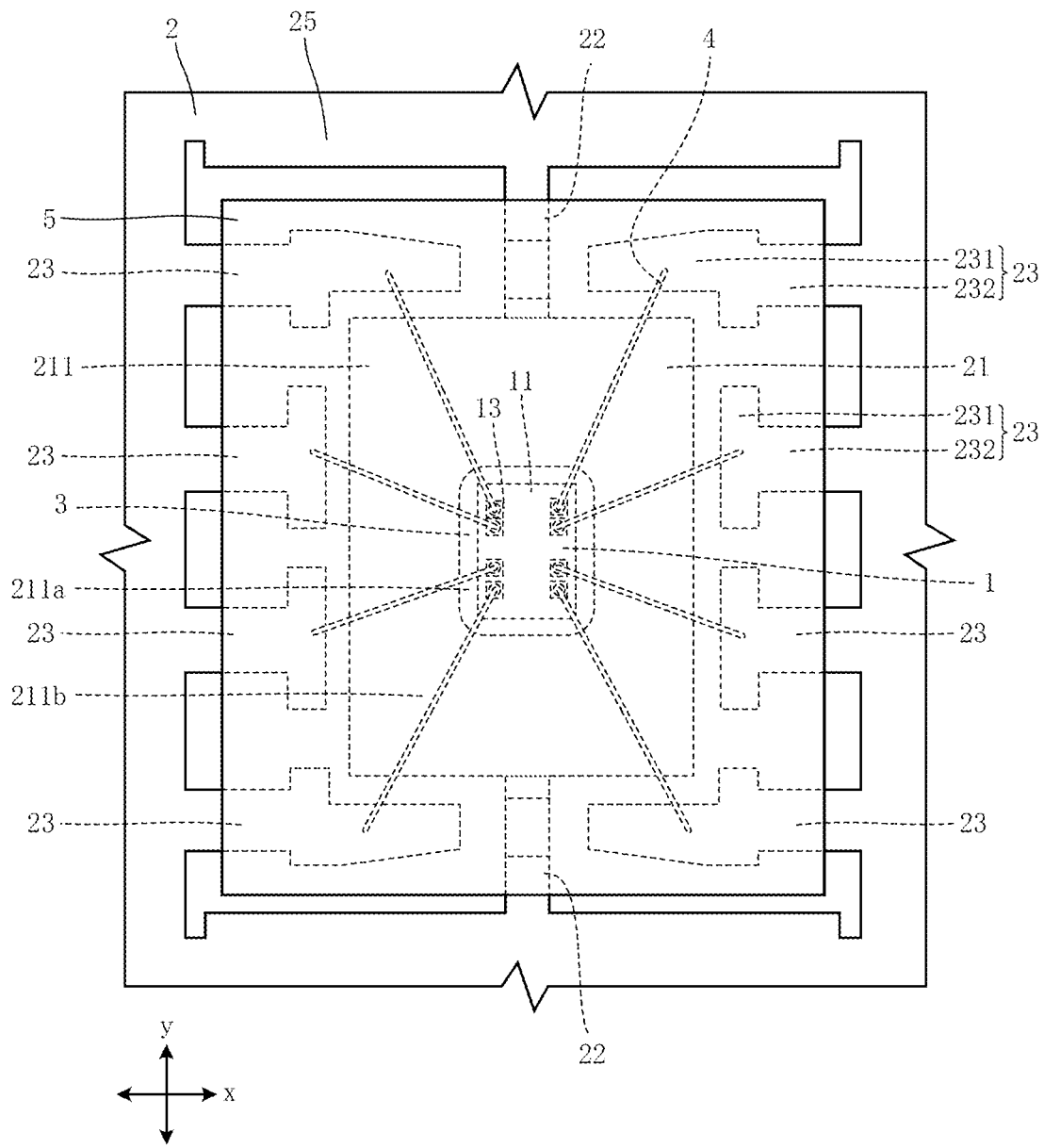
FIG. 13 is a plan view illustrating a step of the method for manufacturing an electronic device according to the first embodiment.

Next, as shown in FIG. 13, a resin member 5 is formed. The resin member 5 is formed by, for example, transfer molding. The material that constitutes the resin member 5 contains a second composition in the form of a solid. The second composition is, for example, an epoxy resin.

Next, the lead frame 2 and the resin member 5 are cut to singulate individual electronic components 1. For example, the individual electronic components 1 can be obtained by blade dicing.

An electronic device A1 as shown in FIGS. 1 to 7 is formed through the steps described above. The manufacturing method described above is merely an example.

The electronic device A1 configured as described above has the following advantageous effects.

In the electronic device A1, the electronic component 1 is fixedly attached to the lead frame 2 (the die pad portion 21) by the bonding material 3 (solid). The lead frame 2 (the die pad portion 21) includes the obverse surface 211 on which the electronic component 1 is mounted. The obverse surface 211 includes the first region 211a where the plurality of grooves 711 are formed and the second region 211b that surrounds the first region 211a as viewed in a plan view. The bonding material 3 is in contact with the first region 211a, and is not in contact with the second region 211b. With this configuration, the bonding material 3 is not formed in the second region 211b that surrounds the first region 211a, and thus the likelihood of the thickness of the bonding material 3 being thin or non-uniform in the first region 211a can be suppressed. For example, if the bonding material 3 has a non-uniform thickness, the electronic component 1 will be fixedly attached in an inclined state, which causes a bonding failure of the electronic component 1, a bonding failure of the connecting members 4, and the like. On the other hand, in the electronic device A1, the likelihood of the thickness of the bonding material 3 being non-uniform can be suppressed, and thus the bonding failures described above can be suppressed. Accordingly, with the electronic device A1, the reliability can be improved.

In the electronic device A1, the bonding material 3 is the first composition (for example, solder) in the form of a solid, and the first region 211a has a higher lyophilicity for the first composition in the form of a liquid than that of the second region 211b. With this configuration, when the bonding material 3 turns into a liquid during the process of manufacturing the electronic device A1 (reflow processing), the bonding material 3 in the form of a liquid tends to remain in the first region 211a that has a relatively high lyophilicity for the first composition in the form of a liquid, and it is therefore possible to prevent the bonding material 3 in the form of a liquid from spreading to the second region 211b that has a relatively low lyophilicity for the first composition in the form of a liquid. Accordingly, in the electronic device A1, as a result of the first region 211a having a higher lyophilicity for the first composition in the form of a liquid than that of the second region 211b, the likelihood of the bonding material 3 in the form of a liquid flowing to the second region 211b can be suppressed.

In the electronic device A1, the plurality of grooves 711 are formed in the first region 211a. With this configuration, the plurality of grooves 711 formed in the first region 211a are filled with the bonding material 3. Accordingly, due to the anchor effect, the adhesion strength of the bonding material 3 to the die pad portion 21 (the first region 211a) increases. Furthermore, the plurality of grooves 711 are formed through laser processing, and thus fine irregularities are formed on the surfaces of the plurality of grooves 711. Accordingly, due to the anchor effect, the adhesion strength of the bonding material 3 to the die pad portion 21 (the first region 211a) can be further improved.

In the electronic device A1, the resin member 5 is the second composition (for example, an epoxy resin) in the form of a solid. The plurality of grooves 721 are formed in the second region 211b, and due to the plurality of grooves 721, the second region 211b has a lyophilicity for the second composition in the form of a liquid. With this configuration, the plurality of grooves 721 formed in the second region 211b are filled with the resin member 5. Accordingly, due to the anchor effect, the adhesion strength of the resin member 5 to the die pad portion 21 (the second region 211b) increases. Furthermore, the plurality of grooves 721 are formed through laser processing, and thus fine irregularities are formed on the surfaces of the plurality of grooves 721. Accordingly, due to the anchor effect, the adhesion strength of the resin member 5 to the die pad portion 21 (the second region 211b) can be further improved.

Figure 14:
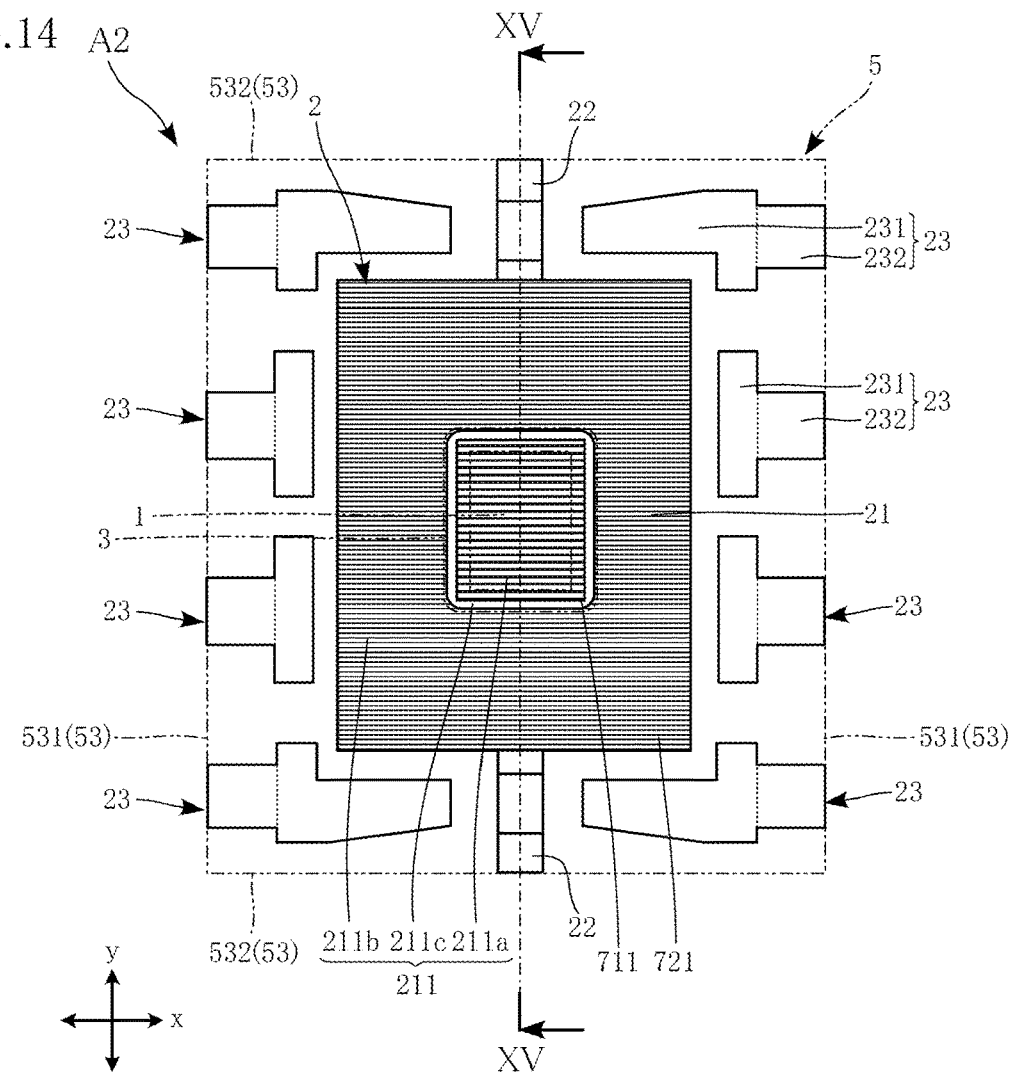
FIG. 14 is a plan view of an electronic device according to a second embodiment.
Figure 15:
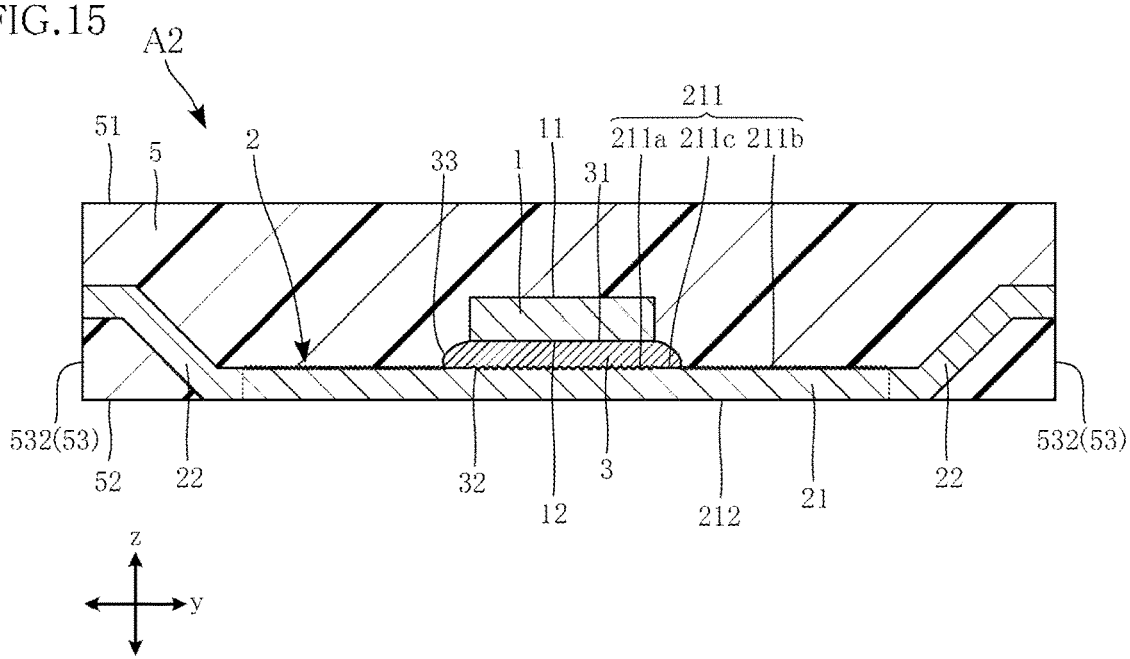
FIG. 15 is a cross-sectional view taken along the line XV-XV shown in FIG. 14.

FIGS. 14 and 15 show an electronic device according to a second embodiment. An electronic device A2 according to the second embodiment is different from the electronic device A1 in that the electronic device A2 further includes a third region 211c in the obverse surface 211 of the die pad portion 21. FIG. 14 is a plan view of the electronic device A2. In FIG. 14, the electronic component 1, the bonding material 3, and the resin member 5 are indicated by imaginary lines, and an illustration of the connecting members 4 is omitted. FIG. 15 is a cross-sectional view taken along the line XV-XV shown in FIG. 14.

The third region 211c is provided between the first region 211a and the second region 211b as viewed in a plan view. The third region 211c has, for example, a rectangular annular shape as viewed in a plan view. The third region 211c is configured such that an inner edge thereof is in contact with the outer edge of the first region 211a, and an outer edge thereof is in contact with the inner edge of the second region 211b as viewed in a plan view. No grooves are formed in the third region 211c, and the third region 211c is flat. The third region 211c is plated with, for example, an Ag coating (a silver coating). As shown in FIG. 15, the third region 211c is in contact with the bonding material 3. In the present embodiment, the second surface 32 of the bonding material 3 is in contact with both the first region 211a and the third region 211c, and the second surface 32 of the bonding material 3 overlaps the first region 211a and the third region 211c as viewed in a plan view. However, the third region 211c may have a configuration different from the example shown in FIG. 15. The third region 211c may be configured by forming a plurality of grooves 711 continuously from the first region 211a and plating the plurality of grooves 711 with an Ag coating. The third region 211c is formed in the step of forming the first region 211a and the second region 211b in the die pad portion 21 of the lead frame 2.

Due to the Ag coating that has been formed, the third region 211c has a lyophilicity for the first composition in the form of a liquid. The third region 211c has a higher lyophilicity for the first composition in the form of a liquid than that of the first region 211a. As described above, the first region 211a has a higher lyophilicity for the first composition in the form of a liquid than that of the second region 211b, and thus the third region 211c has a higher lyophilic for the first composition in the form of a liquid than that of the second region 211b.

The method for manufacturing the electronic device A2 is different from the method for manufacturing the electronic device A1 in that the third region 211c is formed. Other than this, the method for manufacturing the electronic device A2 is substantially the same as the method for manufacturing the electronic device A1.

In the electronic device A2, the obverse surface 211 of the die pad portion 21 (the lead frame 2) includes the first region 211a where the plurality of grooves 711 are formed, and the bonding material 3 is in contact with the first region 211a. With this configuration, in the electronic device A2, as with the electronic device A1, the bonding material 3 is not formed in the second region 211b that surrounds the first region 211a, and thus the likelihood of the thickness of the bonding material 3 being thin or non-uniform in the first region 211a can be suppressed. Accordingly, with the electronic device A2, as with the electronic device A1, the reliability can be improved.

In the electronic device A2, in the obverse surface 211 of the die pad portion 21, the third region 211c is formed between the first region 211a and the second region 211b as viewed in a plan view. The third region 211c has a higher lyophilicity for the first composition in the form of a liquid than that of the second region 211b. With this configuration, when the bonding material 3 turns into a liquid during the process of manufacturing the electronic device A2 (reflow processing), the bonding material 3 in the form of a liquid tends to remain in the third region 211c that has a relatively high lyophilicity for the first composition in the form of a liquid, and it is therefore possible to prevent the bonding material 3 in the form of a liquid from spreading to the second region 211b that has a relatively low lyophilicity for the first composition in the form of a liquid. Accordingly, in the electronic device A2, as a result of the third region 211c having a higher lyophilicity for the first composition in the form of a liquid than that of the second region 211b, the likelihood of the bonding material 3 in the form of a liquid flowing to the second region 211b can be suppressed.

In the electronic device A2, the third region 211c has a higher lyophilicity for the first composition in the form of a liquid than that of the first region 211a. With this configuration, the difference in the lyophilicity for the first composition in the form of a liquid at a boundary between the third region 211c and the second region 211b is larger than that at a boundary between the first region 211a and the second region 211b. Accordingly, in the electronic device A2, it is possible to more effectively suppress the likelihood of the bonding material 3 in the form of a liquid flowing to the second region 211b, as compared with the electronic device A1. That is, with the electronic device A2, the reliability can be further improved as compared with the electronic device A1.

Other than the foregoing, the electronic device A2 has the same configuration as that of the electronic device A1, and thus can provide the same advantageous effects as those of the electronic device A1.

In the second embodiment, an example was described in which the third region 211c is plated with an Ag coating such that the third region 211c has a lyophilicity for the first composition (the bonding material 3) in the form of a liquid, and the lyophilicity of the third region 211c for the first composition in the form of a liquid is higher than that of the first region 211a, but the configuration is not limited thereto. Instead of plating the third region 211c with an Ag coating, a coating agent or the like may be used as long as the third region 211c has a higher lyophilicity for the first composition in the form of a liquid than that of the first region 211a.

Figure 16:
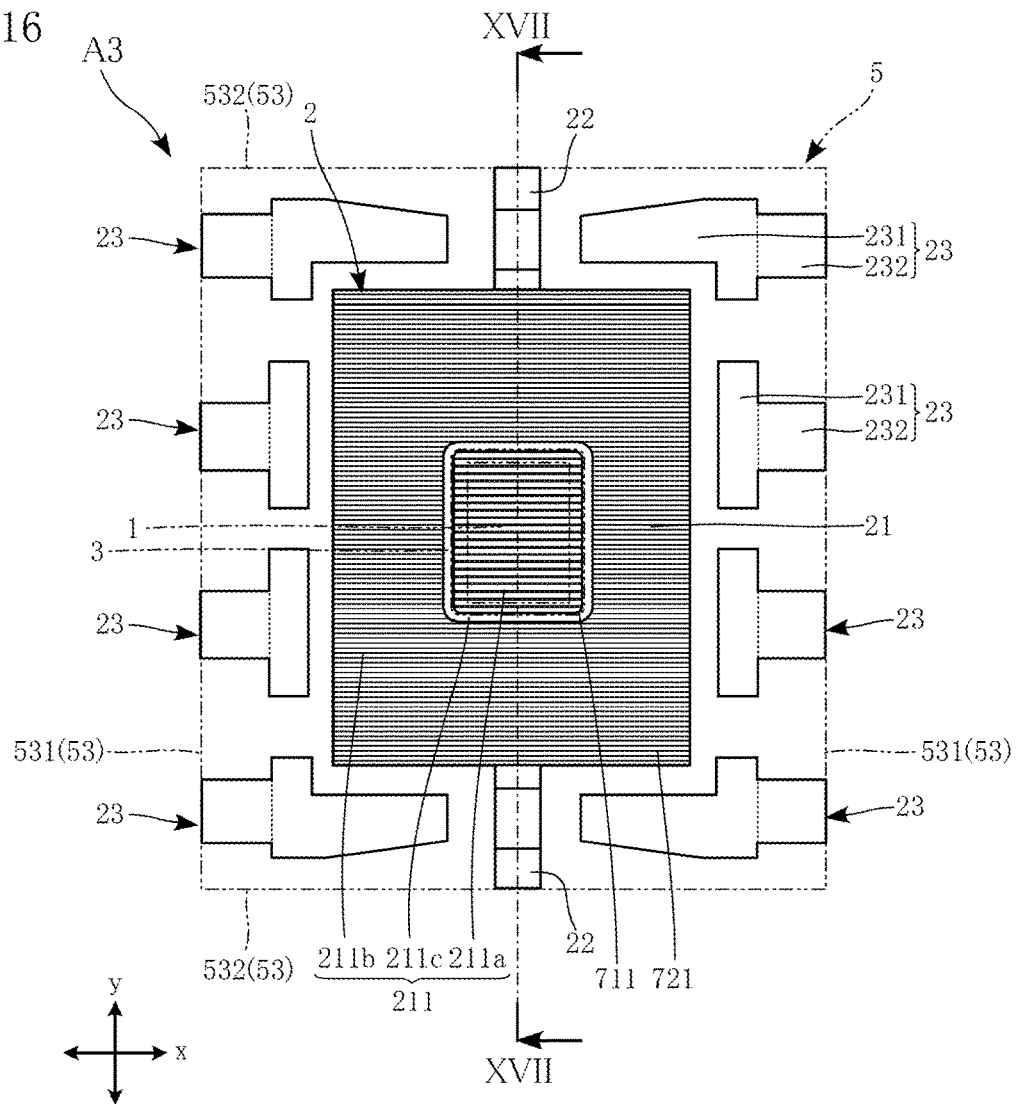
FIG. 16 is a plan view of an electronic device according to a third embodiment.
Figure 17:
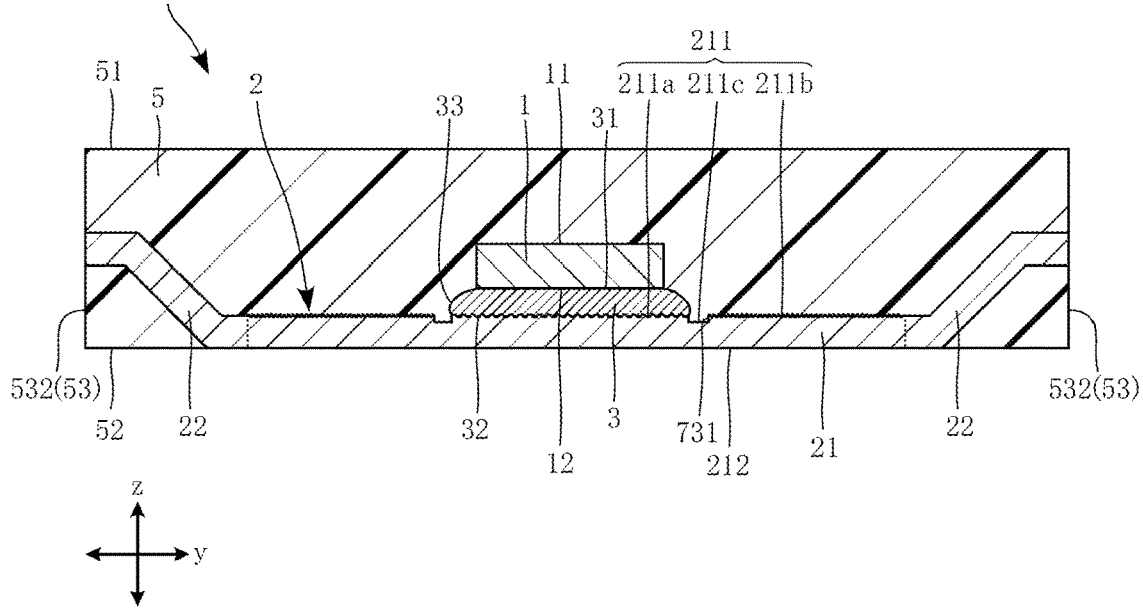
FIG. 17 is a cross-sectional view taken along the line XVII-XVII shown in FIG. 16.

FIGS. 16 and 17 show an electronic device according to a third embodiment. An electronic device A3 according to the third embodiment is different from the electronic device A2 in that the third region 211c is recessed relative to the first region 211a and the second region 211b. FIG. 16 is a plan view of the electronic device A3. In FIG. 16, the electronic component 1, the bonding material 3, and the resin member 5 are indicated by imaginary lines, and an illustration of the connecting members 4 is omitted. FIG. 17 is a cross-sectional view taken along the line XVII-XVII shown in FIG. 16.

In the electronic device A3, as described above, the third region 211c is recessed relative to the first region 211a and the second region 211b. In the third region 211c, a groove 731 that surrounds the first region 211a is formed. As shown in FIG. 17, the third region 211c of the present embodiment is not in contact with the bonding material 3. In the present embodiment, the second surface 32 of the bonding material 3 is in contact with the first region 211a, and is not in contact with the third region 211c. Also, the third surface 33 of the bonding material 3 is configured such that a portion (the outer periphery as viewed in a plan view) thereof does not overlap the second region 211b, and overlaps the third region 211c as viewed in a plan view. The groove 731 has, for example, a rectangular annular shape as viewed in a plan view, and an inner edge of the groove 731 is connected to the outer edge of the first region 211a and an outer edge of the groove 731 is connected to the inner edge of the second region 211b. The groove 731 has a width of, for example, about 50 to 200 μm and a depth of, for example, about 30 to 100 μm. The groove 731 may be formed through, for example, laser processing or etching.

The method for manufacturing the electronic device A3 is different from the method for manufacturing the electronic device A2 in that the third region 211c is formed in a different manner. Other than this, the method for manufacturing the electronic device A3 is substantially the same as the method for manufacturing the electronic device A2.

In the electronic device A3, the obverse surface 211 of the die pad portion 21 (the lead frame 2) includes a first region 211a where a plurality of grooves 711 are formed, and the bonding material 3 is in contact with the first region 211a. With this configuration, in the electronic device A3, as with the electronic device A1, the bonding material 3 is not formed in the second region 211b that surrounds the first region 211a, and thus the likelihood of the thickness of the bonding material 3 being thin or non-uniform in the first region 211a can be suppressed. Accordingly, with the electronic device A3, as with the electronic device A1, the reliability can be improved.

In the electronic device A3, in the obverse surface 211 of the die pad portion 21, the third region 211c is formed between the first region 211a and the second region 211b as viewed in a plan view. In the third region 211c, the groove 731 is formed, and due to the groove 731, the third region 211c is recessed toward the lower side in the z direction from the first region 211a and the second region 211b. With this configuration, in the process of manufacturing the electronic device A3 (reflow processing), the bonding material 3 in the form of a liquid remains in the first region 211a by the action of surface tension at a boundary between the first region 211a and the third region 211c, and thus the likelihood of the bonding material 3 flowing to the third region 211c is suppressed. For this reason, the bonding material 3 is not in contact with the third region 211c. Accordingly, with the electronic device A3, the likelihood of the bonding material 3 in the form of a liquid flowing to the second region 211b can be suppressed. That is, with the electronic device A3, the reliability can be improved.

Other than the foregoing, the electronic device A3 has the same configuration as that of the electronic device A1 (or A2), and thus can provide the same advantageous effects as those of the electronic device A1 (or A2).

Figure 18:
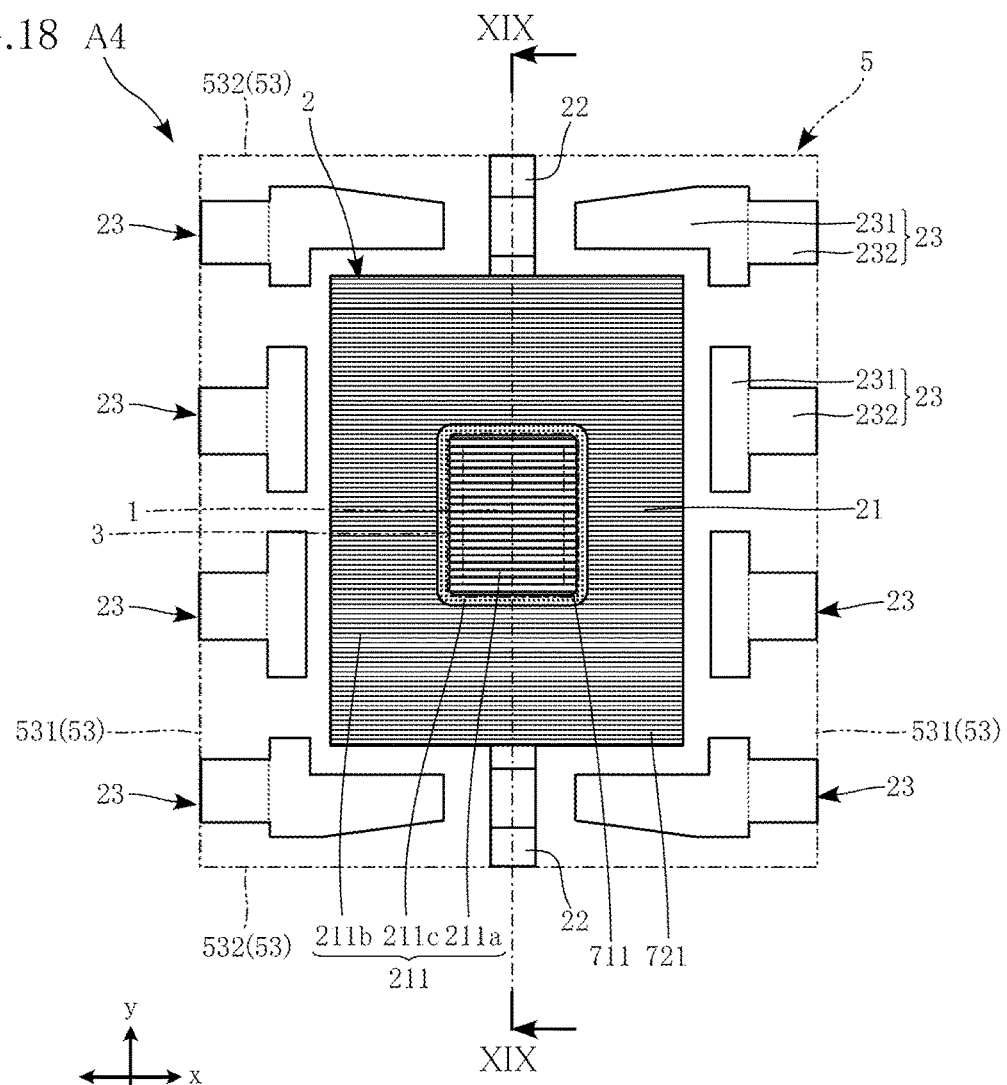
FIG. 18 is a plan view of an electronic device according to a fourth embodiment.
Figure 19:
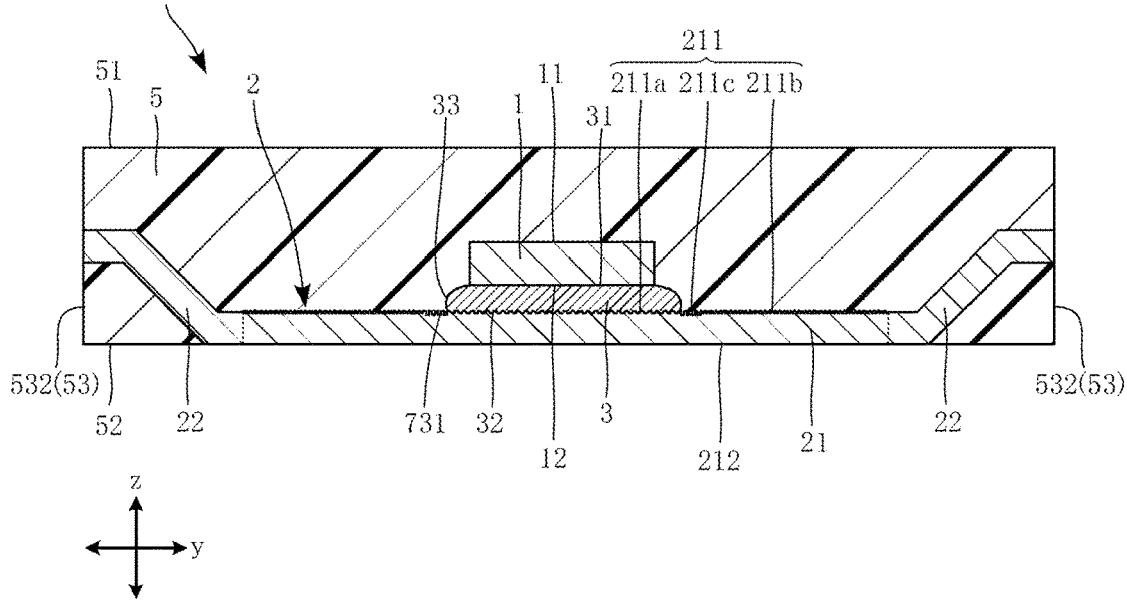
FIG. 19 is a cross-sectional view taken along the line XIX-XIX shown in FIG. 18.

FIGS. 18 and 19 show an electronic device according to a fourth embodiment. An electronic device A4 according to the fourth embodiment is different from the electronic device A2 in that the third region 211c has a liquid repellency to the first composition in the form of a liquid. FIG. 18 is a plan view of the electronic device A4. In FIG. 18, the electronic component 1, the bonding material 3, and the resin member 5 are indicated by imaginary lines, and an illustration of the connecting members 4 is omitted. FIG. 19 is a cross-sectional view taken along the line XIX-XIX shown in FIG. 18.

In the electronic device A4, as shown in FIG. 19, the third region 211c is not in contact with the bonding material 3. In the present embodiment, the second surface 32 of the bonding material 3 is in contact with the first region 211a, and is not in contact with the third region 211c. Also, the third surface 33 of the bonding material 3 is configured such that a portion (the outer periphery as viewed in a plan view) thereof does not overlap the second region 211b, and overlaps the third region 211c as viewed in a plan view. As described above, the third region 211c has a liquid repellency to the first composition in the form of a liquid. That is, because the first composition is solder, the third region 211c has a low solder wettability. A groove 731 is formed in the third region 211c, and in the groove 731, a plurality of protrusions that protrude toward the upper side in the z direction from the bottom surface of the groove 731 are formed. Accordingly, the third region 211c is a rough surface with a plurality of protrusions. The third region 211c has a surface structure (shape) that is similar to, for example, the surface structure (shape) of a lotus leaf, a taro leaf, or the like. Due to the surface structure, the third region 211c has a liquid repellency to the first composition in the form of a liquid. The groove 731 may be formed through, for example, laser processing or etching.

The method for manufacturing the electronic device A4 is different from the method for manufacturing the electronic device A2 in that the third region 211c is formed in a different manner. Other than this, the method for manufacturing the electronic device A4 is substantially the same as the method for manufacturing the electronic device A2.

In the electronic device A4, the obverse surface 211 of the die pad portion 21 (the lead frame 2) includes the first region 211a where the plurality of grooves 711 are formed, and the bonding material 3 is in contact with the first region 211a. With this configuration, in the electronic device A4, as with the electronic device A1, the bonding material 3 is not formed in the second region 211b that surrounds the first region 211a, and thus the likelihood of the thickness of the bonding material 3 being thin or non-uniform in the first region 211a can be suppressed. Accordingly, with the electronic device A4, as with the electronic device A1, the reliability can be improved.

With the electronic device A4, in the obverse surface 211 of the die pad portion 21, the third region 211c is formed between the first region 211a and the second region 211b as viewed in a plan view. The third region 211c has a liquid repellency to the first composition in the form of a liquid. With this configuration, in the process for manufacturing the electronic device A4 (reflow processing), the bonding material 3 in the form of a liquid remains in the first region 211a by the action of surface tension at a boundary between the first region 211a and the third region 211c, and thus the likelihood of the bonding material 3 flowing to the third region 211c is suppressed. For this reason, the bonding material 3 is not in contact with the third region 211c. Accordingly, with the electronic device A4, the likelihood of the bonding material 3 in the form of a liquid flowing to the second region 211b can be suppressed. That is, with the electronic device A4, the reliability can be improved.

Other than the foregoing, the electronic device A4 has the same configuration as that of the electronic device A1 (A2 or A3), and thus can provide the same advantageous effects as those of the electronic device A1 (A2 or A3).

FIGS. 20 to 23 show an electronic device according to a fifth embodiment. An electronic device A5 according to the fifth embodiment is different from the electronic device A1 primarily in that the lead frame 2 has a different configuration.

Figure 20:
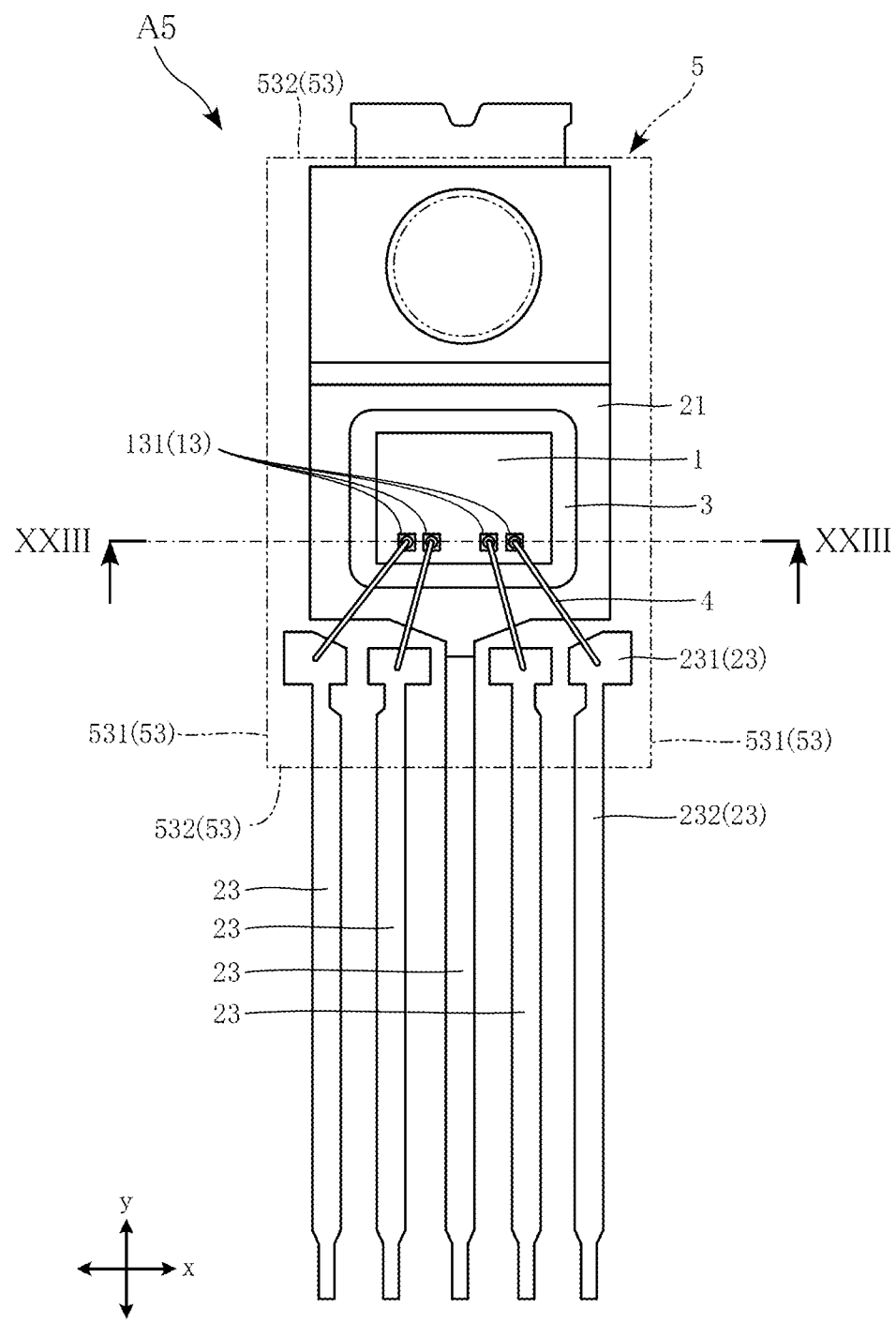
FIG. 20 is a plan view of an electronic device according to a fifth embodiment.
Figure 21:
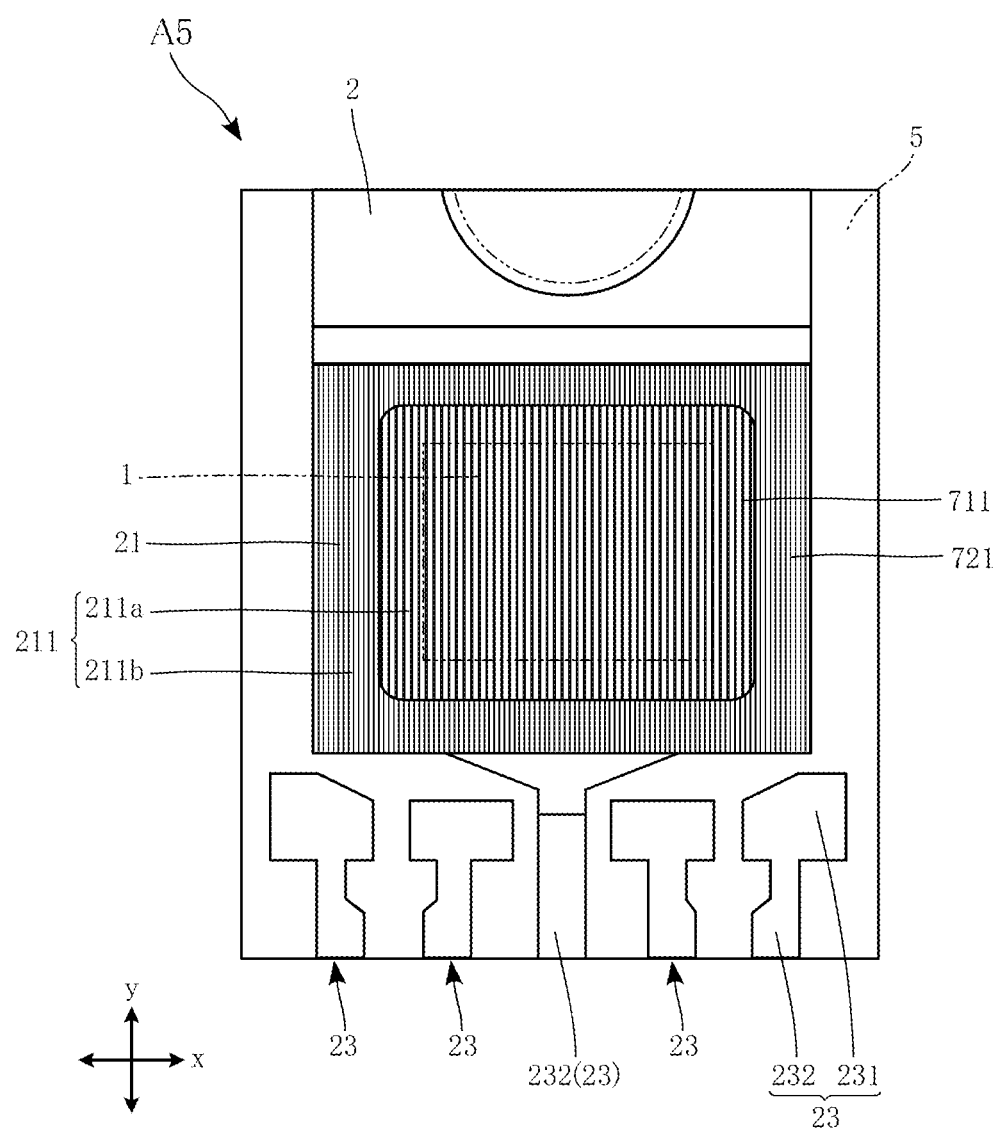
FIG. 21 is a partially enlarged view of a relevant part of FIG. 20.
Figure 22:
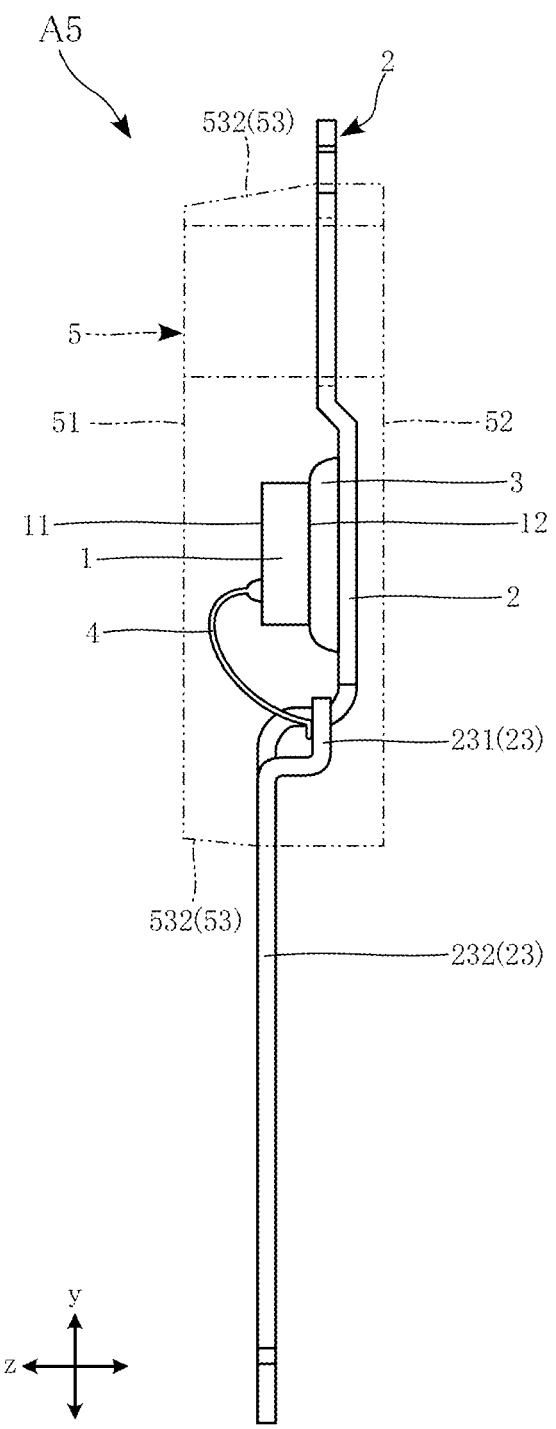
FIG. 22 is a side view (right side view) of the electronic device according to the fifth embodiment.
Figure 23:
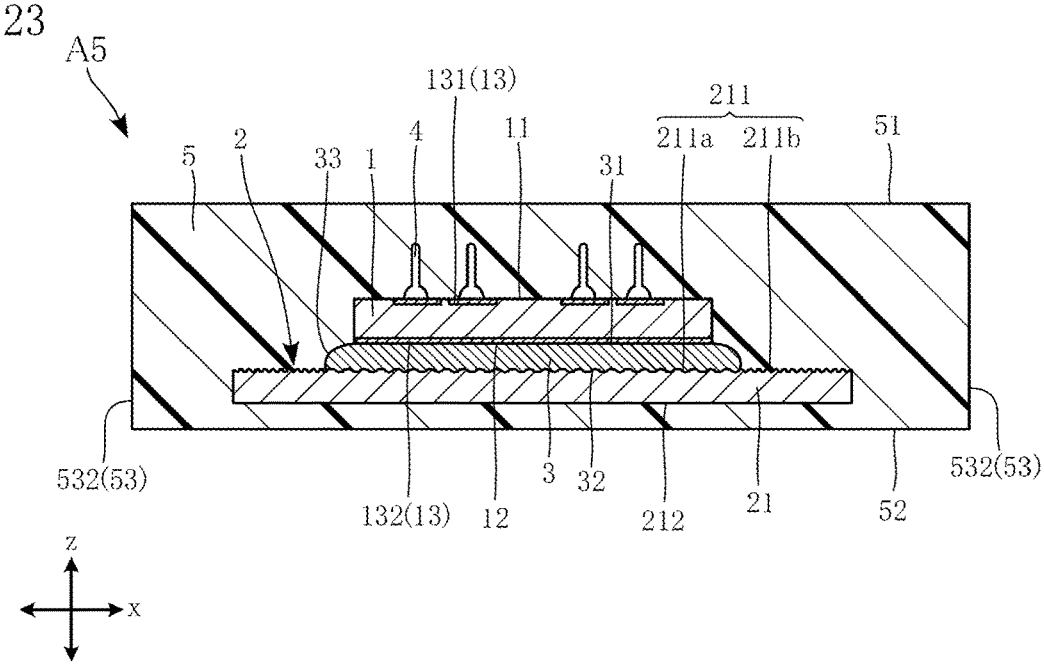
FIG. 23 is a cross-sectional view taken along the line XXIII-XXIII shown in FIG. 20.

FIG. 20 is a plan view of the electronic device A5. In FIG. 20, the resin member 5 is indicated by an imaginary line. FIG. 21 is a partially enlarged view of a relevant part of FIG. 20. In FIG. 20, the electronic component 1 and the resin member 5 are indicated by imaginary lines, and an illustration of the bonding material 3 and the connecting members 4 is omitted. FIG. 22 is a side view (right side view) of the electronic device A5. In FIG. 22, the resin member 5 is indicated by an imaginary line. FIG. 23 is a cross-sectional view taken along the line XXIII-XXIII shown in FIG. 20.

The electronic device A5 is configured in a so-called TO (Transistor Outline) package.

In the electronic device A5, as shown in FIG. 23, each of the electrode pads 13 provided in the electronic component 1 includes an obverse surface electrode 131 and a reverse surface electrode 132. The obverse surface electrode 131 is exposed at the obverse surface 11, and the reverse surface electrode 132 is exposed at the reverse surface 12. The reverse surface electrode 132 is electrically connected to the die pad portion 21 (the lead frame 2) via the bonding material 3. Accordingly, the bonding material 3 according to the present embodiment is conductive.

In the lead frame 2, one of the plurality of terminal lead portions 23 is connected to the die pad portion 21. In the electronic device A5, as shown in FIG. 20, the terminal lead portion 23 that is disposed at the center in the x direction is connected to the die pad portion 21. The terminal lead portion 23 that is connected to the die pad portion 21 does not include a pad portion 231, and includes a terminal portion 232. Also, the terminal lead portions 23 protrude from the resin member 5.

In the lead frame 2, as with the electronic device A1, the obverse surface 211 of the die pad portion 21 includes the first region 211a and the second region 211b. The first region 211a and the second region 211b have the same configurations as those of the electronic device A1. In the electronic device A5, as shown in FIG. 21, the plurality of grooves 711 formed in the first region 211a have a linear shape extending the y direction, and are arranged in parallel to each other. Likewise, the plurality of grooves 721 formed in the second region 211b have a linear shape extending in the y direction, and are arranged in parallel to each other. As with the electronic device A1, the plurality of grooves 711 and the plurality of grooves 721 may have a linear shape extending in the x direction.

The method for manufacturing the electronic device A5 is different from the method for manufacturing the electronic device A1 in that a different lead frame 2 is prepared. Other than this, the method for manufacturing the electronic device A5 is substantially the same as the method for manufacturing the electronic device A1.

In the electronic device A5, the obverse surface 211 of the die pad portion 21 (the lead frame 2) includes the first region 211a where the plurality of grooves 711 are formed, and the bonding material 3 is in contact with the first region 211a. With this configuration, in the electronic device A5, as with the electronic device A1, the bonding material 3 is not formed in the second region 211b that surrounds the first region 211a, and thus the likelihood of the thickness of the bonding material 3 being thin or non-uniform in the first region 211a can be suppressed. Accordingly, with the electronic device A5, as with the electronic device A1, the reliability can be improved.

Other than the foregoing, the electronic device A5 has the same configuration as that of the electronic device A1, and thus can provide the same advantageous effects as those of the electronic device A1.

In the fifth embodiment, an example was described in which the first region 211a and the second region 211b are formed in the obverse surface 211 of the die pad portion 21 of the lead frame 2, but the configuration is not limited thereto. In the obverse surface 211, for example, the third region 211c according to any one of the second to fourth embodiments may also be formed. In this case, the same advantageous effects as those of any one of the second to fourth embodiments can be provided.

Figure 24:
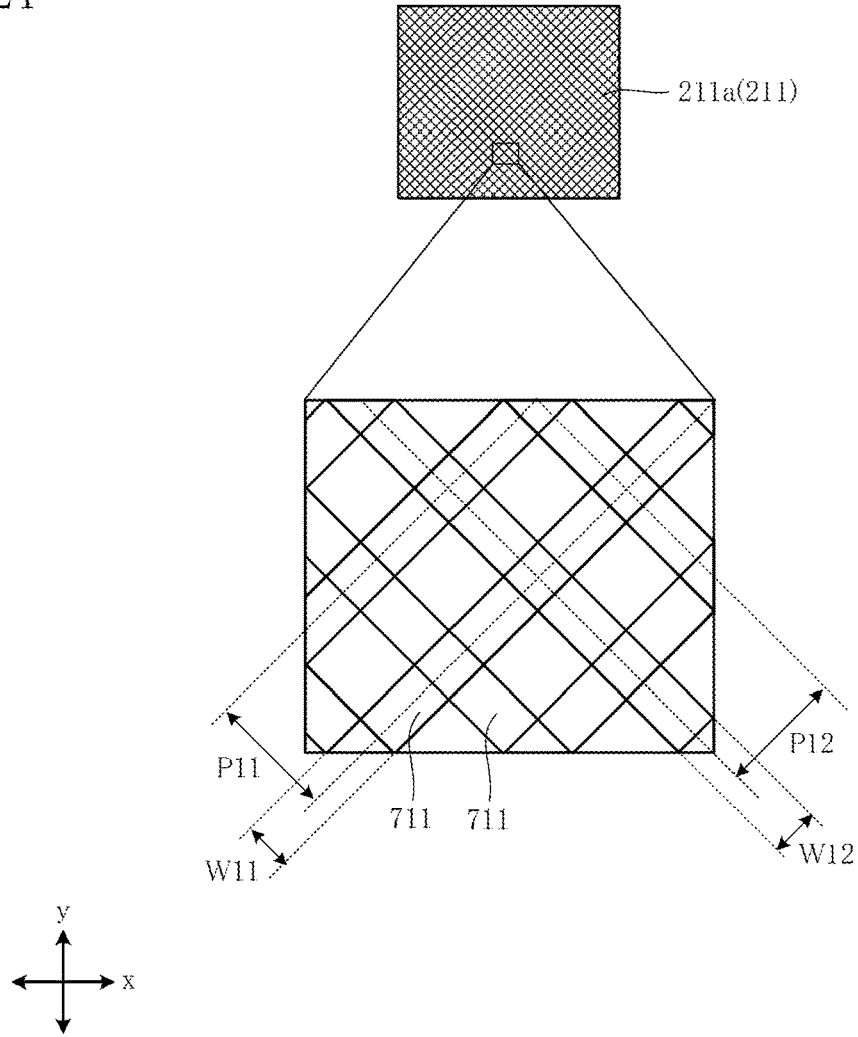
FIG. 24 is a plan view of a first region according to a variation.

In each of the first to fifth embodiments, an example was described in which the plurality of grooves 711 formed in the first region 211a have a linear shape, and are arranged in parallel to each other as viewed in a plan view, but the configuration is not limited thereto. For example, the plurality of grooves 711 may have a linear shape and be arranged in a mesh as viewed in a plan view. FIG. 24 shows the first region 211a where the plurality of linear grooves 711 are arranged in a mesh as viewed in a plan view. In this case, the lyophilicity for the first composition in the form of a liquid and the lyophilicity for the second composition in the form of a liquid may be changed by adjusting a width W11 of the grooves 711 and a width W12 of the grooves 711 (see FIG. 24) as well as a spacing P11 between grooves 711 and a spacing P12 between grooves 711 (see FIG. 24). In the present variation as well, the first region 211a has a lyophilicity for the first composition in the form of a liquid. The same applies to the plurality of grooves 721 that are formed in the second region 211b. That is, the plurality of grooves 721 may have a linear shape, and be arranged in a mesh as viewed in a plan view.

Figure 25:
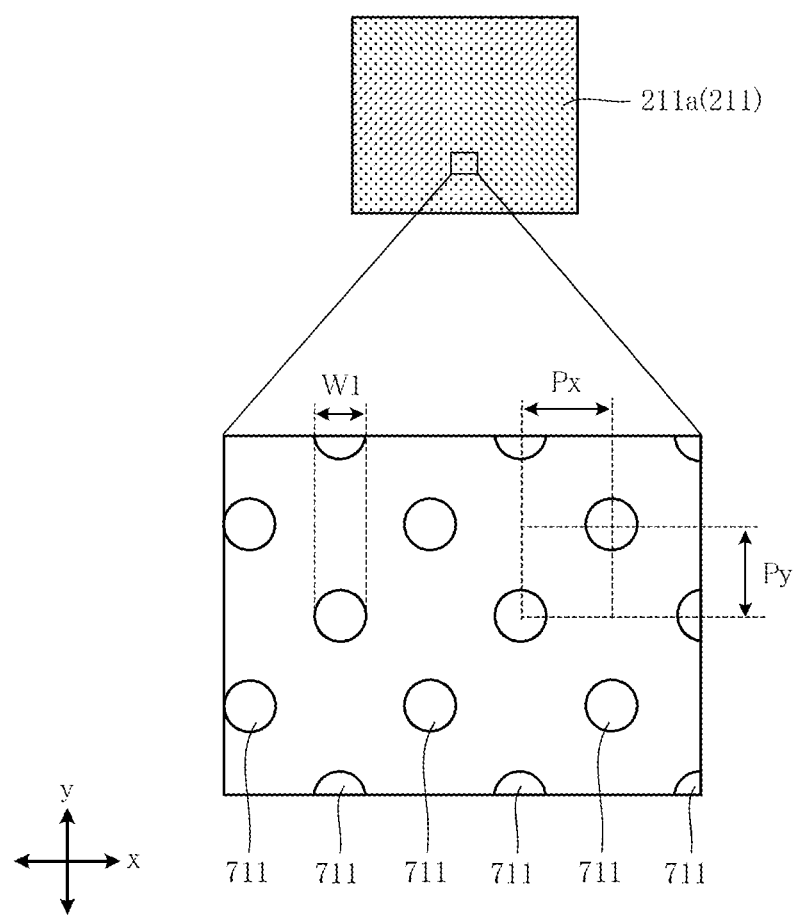
FIG. 25 is a plan view of a first region according to a variation.

In each of the first to fifth embodiments, an example was described in which the plurality of grooves 711 formed in the first region 211a have a linear shape as viewed in a plan view, but the configuration is not limited thereto. For example, the plurality of grooves 711 may have a circular shape (dot shape) and be arranged in a matrix as viewed in a plan view. FIG. 25 shows the first region 211a where the plurality of circular grooves 711 are arranged in a matrix as viewed in a plan view. In this case, the lyophilicity for the first composition in the form of a liquid and the lyophilicity for the second composition in the form of a liquid may be changed by adjusting the width W1 of the grooves 711 (diameter) (see FIG. 25) and an arrangement spacing Px between grooves 711 and an arrangement spacing Py between grooves 711 (see FIG. 25). In the present variation as well, the first region 211a has a lyophilicity for the first composition in the form of a liquid. The same applies to the plurality of grooves 721 that are formed in the second region 211b. That is, the plurality of grooves 721 may have a circular shape and be arranged in a matrix as viewed in a plan view.

In each of the first to fifth embodiments, an example was described in which the plurality of grooves 711 formed in the first region 211a have a linear shape as viewed in a plan view, but the configuration is not limited thereto. For example, the plurality of grooves 711 may be in the shape of a wave-shaped or crank-shaped curve as viewed in a plan view. For example, the grooves 711 in the shape of a wave-shaped or crank-shaped curve as viewed in a plan view may be formed by moving laser light in the shape of a wave or a crank instead of linearly moving laser light during the formation of the grooves 711. As used herein, the term "crank-shaped" is not limited to a shape with a right bending angle, but also encompasses a shape with an acute bending angle and a shape with an obtuse bending angle. In the present variation as well, the first region 211a has a lyophilicity for the first composition in the form of a liquid. The same applies to the plurality of grooves 721 that are formed in the second region 211b. That is, the plurality of grooves 721 may be in the shape of a wave-shaped or crank-shaped curve as viewed in a plan view.

In the first to fifth embodiments, the arrangement patterns of the plurality of grooves 711 formed in the first region 211a, the plurality of grooves 721 formed in the second region 211b, and the groove 731 formed in the third region 211c are not limited to those described above. The first region 211a, the second region 211b, and the third region 211c may be configured to have lyophilicity or liquid repellency described above. For example, the grooves 711, 721, and 731 may be arranged in an arrangement pattern based on well-known biomimetics so as to have lyophilicity or liquid repellency.

In each of the first to fifth embodiments, an example was described in which the electronic device includes one electronic component 1, but the electronic device may include a plurality of electronic components 1. In this case, the first region 211a is formed on the lower side of an electronic component 1, and an electronic component 1 may be bonded onto the first region 211a via the bonding material 3.

In each of the first to fifth embodiments, an example was shown in which a plurality of grooves 721 are formed in the second region 211b. However, the configuration is not limited thereto. For example, the second region 211b may be flat.

The electronic device and the method for manufacturing an electronic device according to the present disclosure are not limited to the embodiments given above. Various modifications can be made to the designs of specific configurations of the constituent elements of the electronic device of the present disclosure and specific processing operations of the steps of the method for manufacturing an electronic device of the present disclosure.

The electronic device and the method for manufacturing an electronic device according to the present disclosure encompass embodiments recited in the following clauses.

Clause 1.

An electronic device comprising:
an electronic component;
a support member that includes a mount surface on which the electronic component is mounted; and
a bonding material that is provided between the electronic component and the support member to fixedly attach the electronic component to the support member,
wherein the mount surface includes a first region where a plurality of grooves are formed and a second region that surrounds the first region as viewed in a first direction, and
the bonding material is in contact with the first region, and is not in contact with the second region.

Clause 2.

The electronic device according to Clause 1, wherein the bonding material contains a first composition in the form of a solid, and
the first region has a lyophilicity for the first composition in the form of a liquid, and the lyophilicity for the first composition in the form of a liquid is higher than that of the second region.

Clause 3.

The electronic device according to Clause 2, wherein the first composition is solder.

Clause 4.

The electronic device according to Clause 2 or 3, wherein the mount surface further includes a third region that is provided between the first region and the second region as viewed in the first direction.

Clause 5.

The electronic device according to Clause 4, wherein the third region is in contact with the bonding material.

Clause 6.

The electronic device according to Clause 5, wherein the third region has a higher lyophilicity for the first composition in the form of a liquid than that of the first region.

Clause 7.

The electronic device according to Clause 5 or 6, wherein the third region is plated with an Ag coating.

Clause 8.

The electronic device according to Clause 4, wherein the third region is not in contact with the bonding material.

Clause 9.

The electronic device according to Clause 8, wherein the third region is recessed relative to the first region and the second region.

Clause 10.

The electronic device according to Clause 8, wherein the third region has a liquid repellency to the first composition in the form of a liquid.

Clause 11.

The electronic device according to any one of Clauses 1 to 10, further comprising:
a resin member that covers the electronic component and the mount surface,
wherein the resin member contains a second composition in the form of a solid.

Clause 12.

The electronic device according to Clause 11, wherein the second region has a lyophilicity for the second composition in the form of a liquid.

Clause 13.

The electronic device according to Clause 11 or 12, wherein the second composition is an epoxy resin.

Clause 14.

The electronic device according to any one of Clauses 1 to 13, wherein the support member includes a die pad portion that includes the mount surface and a terminal lead portion that is spaced apart from the die pad portion.

Clause 15.

The electronic device according to Clause 14, wherein a surface layer of the die pad portion is made of a metal that contains Cu.

Clause 16.

The electronic device according to Clause 14 or 15, further comprising:
 a connecting member that electrically connects the electronic component and the terminal lead portion.

Clause 17.

The electronic device according to any one of Clauses 1 to 16, wherein a plurality of grooves are formed in the second region, and
 the plurality of grooves formed in the second region are different from the plurality of grooves formed in the first region.

Clause 18.

The electronic device according to Clause 17, wherein the plurality of grooves formed in the first region have a width larger than that of the plurality of grooves formed in the second region.

Clause 19.

The electronic device according to Clause 17 or 18, wherein an arrangement spacing between the plurality of grooves formed in the first region is larger than that between the plurality of grooves formed in the second region.

Clause 20.

The electronic device according to any one of Clauses 17 to 19, wherein the plurality of grooves formed in the first region are linear and are arranged in parallel to each other.

Clause 21.

The electronic device according to any one of Clauses 17 to 20, wherein the plurality of grooves formed in the second region are linear and are arranged in parallel to each other.

Clause 22.

The electronic device according to any one of Clauses 1 to 21, wherein the first region has a rectangular shape as viewed in the first direction.

Clause 23.

A method for manufacturing an electronic device, the method comprising:
 a first step of preparing a support member that includes a mount surface;
 a second step of forming, in the mount surface, a first region and a second region that surrounds the first region as viewed in a first direction;
 a third step of applying a bonding material to the first region;
 a fourth step of placing an electronic component on the bonding material; and
 a fifth step of heating and cooling the bonding material such that the electronic component is fixedly attached to the support member by the bonding material,
 wherein, in the second step, the first region is formed by forming a plurality of grooves in a portion of the mount surface, and
 the bonding material after the fifth step is in contact with the first region, and is not in contact with the second region.

The invention claimed is:

1. An electronic device comprising:
 an electronic component;
 a support member that includes a mount surface on which the electronic component is mounted; and
 a bonding material that is provided between the electronic component and the support member to fixedly attach the electronic component to the support member,
 wherein the mount surface includes a first region where a plurality of first grooves are formed and a second region where a plurality of second grooves are formed, the second region surrounding the first region as viewed in a first direction,
 the plurality of first grooves overlap with the electronic component as viewed in the first direction,
 in plan view of the mount surface, the plurality of first grooves and the plurality of second grooves extend linearly in a direction perpendicular to the first direction,
 the plurality of first grooves are arranged in parallel to each other,
 the bonding material is in contact with the first region, and is not in contact with the second region,
 at least one of the plurality of second grooves has an end that reaches an edge of the mount surface, and
 the mount surface further includes a third region that is provided between the first region and the second region as viewed in the first direction.

2. The electronic device according to claim 1, wherein the bonding material contains a first composition that varies between the form of a solid and the form of a liquid depending on temperature, and
 the first region has a lyophilicity for the first composition in the form of a liquid, and the lyophilicity for the first composition in the form of a liquid is higher than that of the second region.

3. The electronic device according to claim 2, wherein the first composition is solder.

4. The electronic device according to claim 1, wherein the third region is in contact with the bonding material.

5. The electronic device according to claim 4, wherein the third region has a higher lyophilicity for the first composition in the form of a liquid than that of the first region.

6. The electronic device according to claim 1, wherein the third region is plated with an Ag coating.

7. The electronic device according to claim 1, wherein the third region is not in contact with the bonding material.

8. The electronic device according to claim 1, wherein the third region is recessed relative to the first region and the second region.

9. The electronic device according to claim 7, wherein the third region has a liquid repellency to the first composition in the form of a liquid.

10. The electronic device according to claim 1, further comprising:
 a resin member that covers the electronic component and the mount surface,
 wherein the resin member contains a second composition in the form of a solid.

11. The electronic device according to claim 10, wherein the second region has a lyophilicity for the second composition in the form of a liquid.

12. The electronic device according to claim 10, wherein the second composition is an epoxy resin.

13. The electronic device according to claim 1, wherein the support member includes a die pad portion that includes the mount surface and a terminal lead portion that is spaced apart from the die pad portion.

14. The electronic device according to claim 13, wherein a surface layer of the die pad portion is made of a metal that contains Cu.

15. The electronic device according to claim 13, further comprising a connecting member that electrically connects the electronic component and the terminal lead portion.

16. The electronic device according to claim 1, wherein the plurality of second grooves have a width different from that of the plurality of first grooves.

17. The electronic device according to claim 16, wherein the plurality of first grooves have a width larger than that of the plurality of second grooves.

18. The electronic device according to claim 16, wherein an arrangement spacing between the plurality of first grooves is larger than that between the plurality of second grooves.

19. The electronic device according to claim 16, wherein the plurality of second grooves are arranged in parallel to each other.

20. The electronic device according to claim 1, wherein the first region has a rectangular shape as viewed in the first direction.

21. A method for manufacturing an electronic device, the method comprising:
    a first step of preparing a support member that includes a mount surface;
    a second step of forming, in the mount surface, a first region, a second region surrounding the first region as viewed in a first direction, and a third region provided between the first region and the second region as viewed in the first direction;
    a third step of applying a bonding material to the first region;
    a fourth step of placing an electronic component on the bonding material; and
    a fifth step of heating and cooling the bonding material such that the electronic component is fixedly attached to the support member by the bonding material,
    wherein, in the second step, a plurality of first grooves in the first region are formed and a plurality of second grooves in the second region are formed,
    the plurality of first grooves overlap with the electronic component in plan view,
    the plurality of first grooves and the plurality of second grooves extend linearly in a direction perpendicular to the first direction,
    the plurality of first grooves are arranged in parallel to each other,
    the bonding material after the fifth step is in contact with the first region, and is not in contact with the second region, and
    at least one of the plurality of second grooves has an end that reaches an edge of the mount surface.

22. The electronic device according to claim 13, further comprising a sealing resin covering the electronic component and the mount surface,
    wherein the support member includes the terminal lead portion, and
    the terminal lead portion protrudes from the sealing resin.

* * * * *